(12) United States Patent
Yamada et al.

(10) Patent No.: US 9,888,190 B2
(45) Date of Patent: Feb. 6, 2018

(54) IMAGING DEVICE

(71) Applicant: Panasonic Intellectual Property Management Co., Ltd., Osaka (JP)

(72) Inventors: Takayoshi Yamada, Hyogo (JP); Masashi Murakami, Kyoto (JP); Kazuko Nishimura, Kyoto (JP); Hidenari Kanehara, Kyoto (JP); Yasuo Miyake, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/351,075

(22) Filed: Nov. 14, 2016

(65) Prior Publication Data
US 2017/0163917 A1 Jun. 8, 2017

(30) Foreign Application Priority Data

Dec. 3, 2015 (JP) .................................. 2015-236864

(51) Int. Cl.
*H04N 5/369* (2011.01)
*H04N 5/232* (2006.01)
(Continued)

(52) U.S. Cl.
CPC ... *H04N 5/35563* (2013.01); *H01L 27/14603* (2013.01); *H04N 5/23245* (2013.01);
(Continued)

(58) Field of Classification Search
CPC ............. H04N 5/35563; H04N 5/3698; H04N 5/3696; H04N 5/357; H04N 5/23245; H01L 27/14603
See application file for complete search history.

(56) References Cited

U.S. PATENT DOCUMENTS

2004/0267488 A1* 12/2004 Strommer ............ A61B 6/4233
702/127
2007/0242148 A1 10/2007 Kawai
(Continued)

FOREIGN PATENT DOCUMENTS

JP  64-069050  3/1989
JP  2004-172858  6/2004
(Continued)

*Primary Examiner* — Hung Lam
(74) *Attorney, Agent, or Firm* — McDermott Will & Emery LLP

(57) ABSTRACT

An imaging device according to the present disclosure includes: a counter electrode; a first pixel electrode facing the counter electrode; a second pixel electrode facing the counter electrode; a third pixel electrode facing the counter electrode; a photoelectric conversion layer sandwiched between the first pixel electrode, the second pixel electrode, and the third pixel electrode, and the counter electrode; a first signal detection circuit electrically connected to the first pixel electrode; a second signal detection circuit electrically connected to the second pixel electrode; a first switching element connected between the third pixel electrode and the first signal detection circuit; and a second switching element connected between the third pixel electrode and the second signal detection circuit.

7 Claims, 21 Drawing Sheets

(51) Int. Cl.
*H04N 5/355* (2011.01)
*H01L 27/146* (2006.01)
*H04N 5/357* (2011.01)

(52) U.S. Cl.
CPC ........... *H04N 5/357* (2013.01); *H04N 5/3696* (2013.01); *H04N 5/3698* (2013.01)

(56) References Cited

U.S. PATENT DOCUMENTS

| | | | | |
|---|---|---|---|---|
| 2010/0271335 | A1* | 10/2010 | Gotoh | G02F 1/13338 345/175 |
| 2011/0102392 | A1* | 5/2011 | Fujioka | G02F 1/13338 345/207 |
| 2013/0050548 | A1* | 2/2013 | Yamashita | H01L 27/14621 348/294 |
| 2013/0300962 | A1* | 11/2013 | Kitani | G02F 1/13306 349/37 |

FOREIGN PATENT DOCUMENTS

| | | |
|---|---|---|
| JP | 2006-094263 | 4/2006 |
| JP | 2007-288522 | 11/2007 |

* cited by examiner

IMAGING DEVICE

BACKGROUND

1. Technical Field

The present disclosure relates to an imaging device.

2. Description of the Related Art

Image sensors using photoelectric conversion have been in widespread use. There is a need for dynamic range expansion in the field of image sensors.

Japanese Unexamined Patent Application Publication No. 2007-288522 discloses a solid-state imaging device 100 having high-sensitivity elements 102a and low-sensitivity elements 102b different in photodiode light-receiving area from each other arrayed in a light-receiving region (FIG. 2). The solid-state imaging device 100 in Japanese Unexamined Patent Application Publication No. 2007-288522 performs shooting using different exposure times for the high-sensitivity elements 102a and the low-sensitivity elements 102b. A wide-dynamic-range image is obtained by separately acquiring pieces of image data from the high-sensitivity elements 102a and pieces of image data from the low-sensitivity element 102b and merging the pieces of image data. If a luminance difference in an image of a subject is small, the exposure time for the low-sensitivity elements 102b is set to be longer. With the setting, an image higher in resolution than a wide-dynamic-range image is obtained.

SUMMARY

There is a need for an imaging device which achieves both wide-dynamic-range shooting and high-resolution shooting while reducing deterioration in an acquired image.

One non-limiting and exemplary embodiment provides an imaging device as described below.

In one general aspect, the techniques disclosed here feature an imaging device including a counter electrode, a first pixel electrode facing the counter electrode, a second pixel electrode facing the counter electrode, a third pixel electrode facing the counter electrode, a photoelectric conversion layer sandwiched between the first pixel electrode, the second pixel electrode, and the third pixel electrode, and the counter electrode, a first signal detection circuit electrically connected to the first pixel electrode, a second signal detection circuit electrically connected to the second pixel electrode, a first switching element connected between the third pixel electrode and the first signal detection circuit, and a second switching element connected between the third pixel electrode and the second signal detection circuit.

It should be noted that general or specific embodiments may be implemented as an element, a device, an device, a module, a system, an integrated circuit, a method, a computer program, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
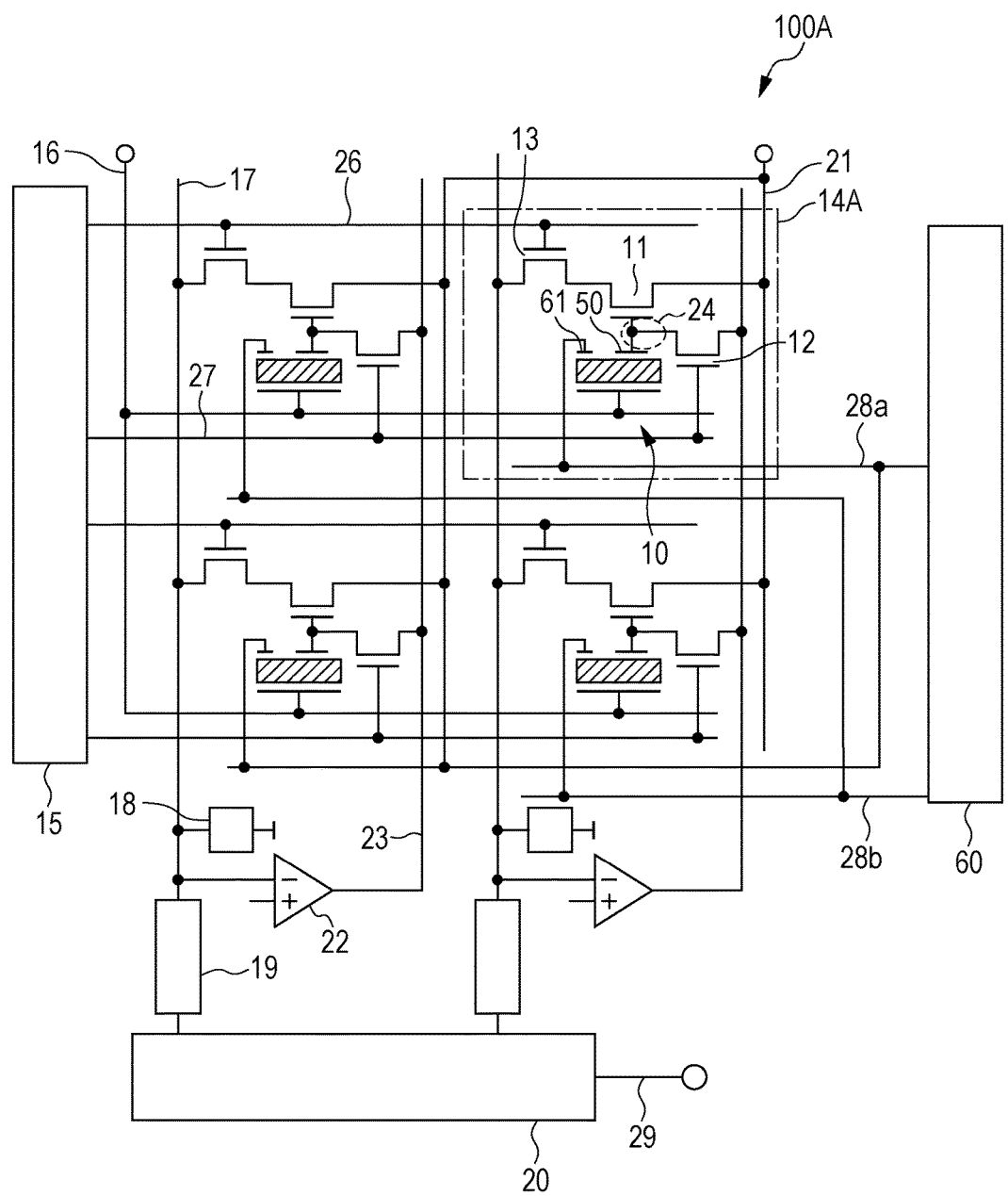
FIG. 1 is a diagram schematically showing one example of the circuit configuration of an imaging device according to a first embodiment of the present disclosure.

The above-described solid-state imaging device 100 in Japanese Unexamined Patent Application Publication No. 2007-288522 performs control such that the high-sensitivity element 102a and the low-sensitivity element 102b are different in exposure time. The difference in exposure time causes deterioration in image quality. For example, an image obtained when a moving object is shot may have unevenness in illuminance. Additionally, acquisition of a high-resolution image especially entails a longer exposure time, and the time required to acquire an image for one frame (which may be referred to as a "frame rate") is longer. There is thus a need for an imaging device for achieving both wide-dynamic-range shooting and high-resolution shooting while reducing deterioration in an acquired image.

The overview of one aspect of the present disclosure is as follows.

[Item 1]

An imaging device having a first mode and a second mode, including a first pixel cell which includes a first pixel electrode, a first signal detection circuit electrically connected to the first pixel electrode, a first auxiliary electrode arranged around the first pixel electrode, a first counter electrode facing the first pixel electrode and the first auxiliary electrode, and a first photoelectric conversion layer arranged between the first pixel electrode and the first auxiliary electrode, and the first counter electrode, a second pixel cell which includes a second pixel electrode, a second signal detection circuit electrically connected to the second pixel electrode, a second auxiliary electrode arranged around the second pixel electrode, a second counter electrode facing the second pixel electrode and the second auxiliary electrode, and a second photoelectric conversion layer arranged between the second pixel electrode and the second auxiliary electrode, and the second counter electrode, and a voltage supply circuit which is electrically connected to the first auxiliary electrode and the second auxiliary electrode and supplies a voltage differing between the first mode and the second mode to at least one of the first auxiliary electrode and the second auxiliary electrode.

According to the configuration of Item 1, switching between the two modes can be performed by changing at least one of respective voltages to be applied to the first auxiliary electrode and the second auxiliary electrode.

[Item 2]

The imaging device according to Item 1, in which an electrode area of the first pixel electrode is larger than an electrode area of the second pixel electrode.

According to the configuration of Item 2, the first pixel cell and the second pixel cell can be used as a high-sensitivity cell and a low-sensitivity cell, respectively.

[Item 3]

The imaging device according to Item 1 or 2, in which a minimum value of a distance between the first pixel electrode and the first auxiliary electrode is smaller than a minimum value of a distance between the second pixel electrode and the second auxiliary electrode.

According to the configuration of Item 3, the first pixel cell and the second pixel cell can be used as a high-sensitivity cell and a low-sensitivity cell, respectively.

[Item 4]

The imaging device according to any one of Items 1 to 3, in which the first pixel electrode, the first auxiliary electrode, the second pixel electrode, and the second auxiliary electrode are at a same layer.

According to the configuration of Item 4, complication of a manufacturing process can be avoided.

[Item 5]

The imaging device according to any one of Items 1 to 4, in which the first photoelectric conversion layer and the second photoelectric conversion layer are each a part of a single continuous layer.

According to the configuration of Item 5, complication of a manufacturing process can be avoided.

[Item 6]

The imaging device according to any one of Items 1 to 5, in which the first counter electrode and the second counter electrode are each a part of a single continuous electrode.

According to the configuration of Item 6, complication of a manufacturing process can be avoided.

[Item 7]

The imaging device according to any one of Items 1 to 6, in which when seen from a direction perpendicular to principal surfaces of the first photoelectric conversion layer and the second photoelectric conversion layer, the first auxiliary electrode has a first opening portion, the second auxiliary electrode has a second opening portion, the first pixel electrode is arranged inside the first opening portion, and the second pixel electrode is arranged inside the second opening portion.

[Item 8]

An imaging device including a counter electrode, a first pixel electrode facing the counter electrode, a second pixel electrode facing the counter electrode, a third pixel electrode facing the counter electrode, a photoelectric conversion layer sandwiched between the first pixel electrode, the second pixel electrode, and the third pixel electrode, and the counter electrode, a first signal detection circuit electrically connected to the first pixel electrode, a second signal detection circuit electrically connected to the second pixel electrode, a first switching element connected between the third pixel electrode and the first signal detection circuit, and a second switching element connected between the third pixel electrode and the second signal detection circuit.

According to the configuration of Item 8, an area ratio between an electrode (electrodes) connected to the first signal detection circuit and an electrode (electrodes) connected to the second signal detection circuit can be changed in accordance with whether the third pixel electrode is connected to the first pixel electrode or the second pixel electrode. The change in the electrode area ratio allows, for example, switching between a wide-dynamic-range shooting mode and a high-resolution shooting mode.

[Item 9]

The imaging device according to Item 8, in which the first pixel electrode, the second pixel electrode, and the third pixel electrode are at a same layer.

[Item 10]

The imaging device according to Item 8 or 9, in which the first switching element and the second switching element electrically connect the third pixel electrode to either one of the first signal detection circuit and the second signal detection circuit.

[Item 11]

The imaging device according to any one of Items 8 to 10, in which a ratio of a sum of an area of the second pixel electrode and an area of the third pixel electrode to an area of the first pixel electrode is not less than 0.01 and not more than 1.

According to the configuration of Item 11, a ratio between an area of an electrode (electrodes) connected to the first signal detection circuit and an area of an electrode (electrodes) connected to the second signal detection circuit can be brought closer to 1 by connecting the third pixel electrode to the second pixel electrode.

[Item 12]

The imaging device according to any one of Items 8 to 11, further including an auxiliary electrode arranged around the first pixel electrode, the second pixel electrode, and the third pixel electrode.

According to the configuration of Item 12, a charge generated between a pixel in question and a different adjacent pixel can be collected by the auxiliary electrode, and occurrence of color mixing between the pixels can be inhibited.

[Item 13]

The imaging device according to any one of Items 1 to 12, further including a distance measurement circuit which calculates a distance from a subject on the basis of an output from the first signal detection circuit and an output from the second signal detection circuit.

According to the configuration of Item 13, so-called image plane phase detection autofocus can be executed without providing a pixel dedicated to distance measurement in a photosensitive region.

[Item 14]

An imaging module including an imaging device according to any one of Items 1 to 13, and a camera signal processing circuit which generates image data on the basis of a pixel signal from the imaging device.

According to the configuration of Item 14, a piece of wide-dynamic-range image data and a piece of high-resolution image data can be acquired with a single device.

Embodiments of the present disclosure will be described below in detail with reference to the drawings. Note that the embodiments described below are all comprehensive or specific examples. Numerical values, shapes, materials, constituent elements, the arrangement and connection forms of the constituent elements, steps, the order of the steps, and the like illustrated in the embodiments below are merely illustrative, and are not intended to limit the present disclosure. Various aspects described in the present specification can be combined as long as there is no contradiction. Among the constituent elements in the embodiments below, those not described in an independent claim representing a top-level concept will be described as optional constituent elements. In the description below, constituent elements having substantially the same functions are denoted by the same reference characters, and a description thereof may be omitted.

First Embodiment

FIG. 1 schematically shows one example of the circuit configuration of an imaging device according to a first embodiment of the present disclosure. An imaging device 100A shown in FIG. 1 includes a plurality of pixel cells 14A and a peripheral circuit. As will be described later in detail, the imaging device 100A is configured to be capable of switching between a wide-dynamic-range mode that allows wide-dynamic-range shooting and a high-resolution mode that allows shooting at a resolution higher than in the wide-dynamic-range mode.

The plurality of pixel cells 14A are, for example, two-dimensionally arrayed on a semiconductor substrate to form a photosensitive region (pixel region). As will be described later, the plurality of pixel cells 14A include first pixel cells which function as high-sensitivity pixel cells in the wide-dynamic-range mode and second pixel cells which function as pixel cells lower in sensitivity than the first pixel cells in the wide-dynamic-range mode. Note that although FIG. 1 shows a configuration with four pixel cells 14A arranged in two rows and two columns, the configuration is merely illustrative. The number and arrangement of pixel cells (pixel cells 14A here) included in the photosensitive region are not limited to those illustrated in FIG. 1.

Each pixel cell 14A includes a photoelectric conversion portion 10, a signal detection transistor 11, a reset transistor 12, and an address transistor (row selection transistor) 13. The signal detection transistor 11, the reset transistor 12, and the address transistor 13 are typically field effect transistors (FETs). Unless otherwise specified, an example will be described below in which an N-channel MOS is used as each of the signal detection transistor 11, the reset transistor 12, and the address transistor 13.

As will be described later in detail with reference to the drawings, the photoelectric conversion portion 10 includes a pixel electrode 50, an auxiliary electrode 61, a counter electrode which faces the pixel electrode 50 and the auxiliary electrode 61, and a photoelectric conversion layer which is arranged between the pixel electrode 50 and the counter electrode. A storage control line 16 which applies a predetermined voltage to the counter electrode of the photoelectric conversion portion 10 when the imaging device 100A is in operation is connected to the photoelectric conversion portion 10 of each pixel cell 14A. The voltage to be supplied to the photoelectric conversion portion 10 via the storage control line 16 can be common to all pixel cells 14A. The voltage to be supplied to the photoelectric conversion portion 10 via the storage control line 16 may be a voltage having fixed magnitude or a time-varying voltage.

The pixel electrode 50 of the photoelectric conversion portion 10 collects, as a signal charge, one of positive and negative charges generated in the photoelectric conversion layer by photoelectric conversion. The auxiliary electrode 61 is configured such that a predetermined voltage can be applied to the auxiliary electrode 61 when the imaging device 100A is in operation. In this example, the auxiliary electrode 61 in each of the plurality of pixel cells 14A constituting the photosensitive region is connected to either one of sensitivity adjustment lines 28a and 28b which are connected to a voltage supply circuit 60. The voltage supply circuit 60 supplies predetermined voltages to the auxiliary electrodes 61 via the sensitivity adjustment lines 28a and 28b when the imaging device 100A is in operation. As will be described later, the voltage to be applied to the auxiliary electrode 61 may be common to the wide-dynamic-range mode and the high-resolution mode or may differ between the wide-dynamic-range mode and the high-resolution mode.

As will be described later in detail with reference to the drawings, the amount of signal charges captured by the pixel electrode 50 can be adjusted by adjusting the voltage to be applied to the auxiliary electrode 61. In other words, the sensitivity of the pixel cell 14A can be adjusted by adjusting the voltage to be applied to the auxiliary electrode 61. For example, the pixel cell 14A having the auxiliary electrode 61 connected to the sensitivity adjustment line 28a and the pixel cell 14A having the auxiliary electrode 61 connected to the sensitivity adjustment line 28b can be made different in sensitivity from each other. Alternatively, the pixel cell 14A having the auxiliary electrode 61 connected to the sensitivity adjustment line 28a and the pixel cell 14A having the auxiliary electrode 61 connected to the sensitivity adjustment line 28b can be made uniform in sensitivity with each other.

In the configuration illustrated in FIG. 1, the pixel cell (hereinafter also referred to as a "first pixel cell") 14A having the auxiliary electrode 61 connected to the sensitivity adjustment line 28a and the pixel cell (hereinafter also referred to as a "second pixel cell") 14A having the auxiliary electrode 61 connected to the sensitivity adjustment line 28b are alternately arranged along a row direction. The pixel cell 14A having the auxiliary electrode 61 connected to the sensitivity adjustment line 28a and the pixel cell 14A having the auxiliary electrode 61 connected to the sensitivity adjustment line 28b are also alternately arranged along a column direction. In the present specification, the row direction refers to a direction in which a row extends while the column direction refers to a direction in which a column extends. That is, in FIG. 1, a longitudinal direction on the sheet surface is the column direction, and a lateral direction on the sheet surface is the row direction. The arrangement of either first pixel cells and the second pixel cells is not limited to the example shown in FIG. 1 and can be arbitrarily set.

The voltage supply circuit 60 at least needs to be configured to be capable of causing at least one of a voltage to be supplied to an auxiliary electrode of a first pixel cell and a voltage to be supplied to an auxiliary electrode of a second pixel cell to differ between two modes and is not limited to a particular power circuit. The voltage supply circuit 60 may be a circuit which generates a predetermined voltage or a circuit which transforms a voltage supplied from a different power source into a predetermined voltage. Hereinafter, a voltage which is supplied from the voltage supply circuit 60 to the auxiliary electrode 61 may be referred to as a sensitivity adjustment voltage.

The voltage supply circuit 60 is typically provided as a part of the peripheral circuit outside the photosensitive region. The voltage supply circuit 60 supplies sensitivity adjustment voltages corresponding to an instruction from a user operating the imaging device 100A or an instruction from a different control circuit or the like of the imaging device 100A to the auxiliary electrodes 61 of the pixel cells 14A via the sensitivity adjustment lines 28a and 28b. The voltage supply circuit 60 may be a part of a vertical scanning circuit 15 (to be described later). An output from the voltage supply circuit 60 may be supplied to the auxiliary electrodes 61 via the vertical scanning circuit 15.

The pixel electrode 50 of the photoelectric conversion portion 10 is connected to a control terminal (a gate here) of the signal detection transistor 11. Signal charges collected by the pixel electrode 50 are stored in a charge storage node 24 between the pixel electrode 50 and the gate of the signal detection transistor 11. That is, a voltage corresponding to the amount of signal charges stored in the charge storage node 24 is applied to the gate of the signal detection transistor 11. An input (a drain here) of the signal detection transistor 11 is connected to a power line 21 (a source follower power source) which supplies a predetermined power voltage to each pixel cell, and the signal detection transistor 11 outputs a voltage corresponding to the amount of signal charges stored in the charge storage node 24. In other words, the signal detection transistor 11 amplifies and outputs a signal generated by the photoelectric conversion portion 10. The charge storage node 24 between the pixel electrode 50 and the gate of the signal detection transistor 11 is connected to an output (a drain here) of the reset transistor 12.

The address transistor 13 is connected to the signal detection transistor 11. The address transistor 13 is connected between an output (a source here) of the signal detection transistor 11 and one of a plurality of vertical signal lines 17 which are provided for respective columns of a pixel array composed of the plurality of pixel cells 14A. As shown in FIG. 1, a gate of the address transistor 13 is connected to an address signal line 26 which is connected to the vertical scanning circuit (also referred to as a "row scanning circuit") 15. The vertical scanning circuit 15 selectively reads out pixel signals from the pixel cells 14A to the vertical signal lines 17 on a row-by-row basis by controlling the level of a voltage to be applied to each address signal line 26.

A load circuit 18 and a column signal processing circuit (also referred to as a "row signal storage circuit") 19 are connected to each of the plurality of vertical signal lines 17. The load circuit 18 and the signal detection transistor 11 form a source follower circuit. The column signal processing circuit 19 performs noise suppression signal processing typified by correlated double sampling, analog-to-digital conversion (AD conversion), and the like. A horizontal signal read circuit (also referred to as a "column scanning circuit") 20 is connected to the column signal processing circuit 19 that is provided for each column of the pixel array so as to correspond to the vertical signal line 17. The horizontal signal read circuit 20 sequentially reads out signals from the plurality of column signal processing circuits 19 to a horizontal common signal line 29.

In the configuration illustrated in FIG. 1, an inverting amplifier (also referred to as a "feedback amplifier") 22 is connected between the vertical signal line 17 and the reset transistor 12. As shown in FIG. 1, the vertical signal line 17 is connected to an inverting input terminal of the inverting amplifier 22. When the imaging device 100A is in operation, a predetermined reference voltage Vref is applied to a noninverting input terminal of the inverting amplifier 22. A feedback line 23 is connected to an output terminal of the inverting amplifier 22. As shown in FIG. 1, the feedback line 23 is provided so as to correspond to each column of the pixel array and is connected to an input of the reset transistor 12 of each pixel cell 14A belonging to the column.

A control terminal (a gate here) of the reset transistor 12 is connected to a reset signal line 27. In this example, the reset signal line 27 is connected to the vertical scanning circuit 15. That is, in the example, the vertical scanning circuit 15 selects the pixel cells 14A in the pixel array on a row-by-row basis by controlling a voltage to be applied to each reset signal line 27 and performs signal voltage readout and resetting of the potentials of the pixel electrodes 50. Focus here on a given column of the pixel array. By turning on the reset transistor 12 and the address transistor 13 in one of the pixel cells 14A belonging to the column, a feedback loop including the inverting amplifier 22 can be formed. The formation of the feedback loop allows the potential of the charge storage node 24 in the pixel cell 14A to converge on a potential at which the potential of the vertical signal line 17 is equal to the above-described reference voltage Vref. In this case, an output voltage from the inverting amplifier 22 can be 0 V or a positive voltage close to 0 V. As the reference voltage Vref, an arbitrary voltage within the range from the power voltage (for example, 3.3 V) to ground (0 V) can be used. In other words, an arbitrary voltage within a fixed range (for example, a voltage other than the power voltage) can be used as a reference voltage in resetting.

Figure 2:
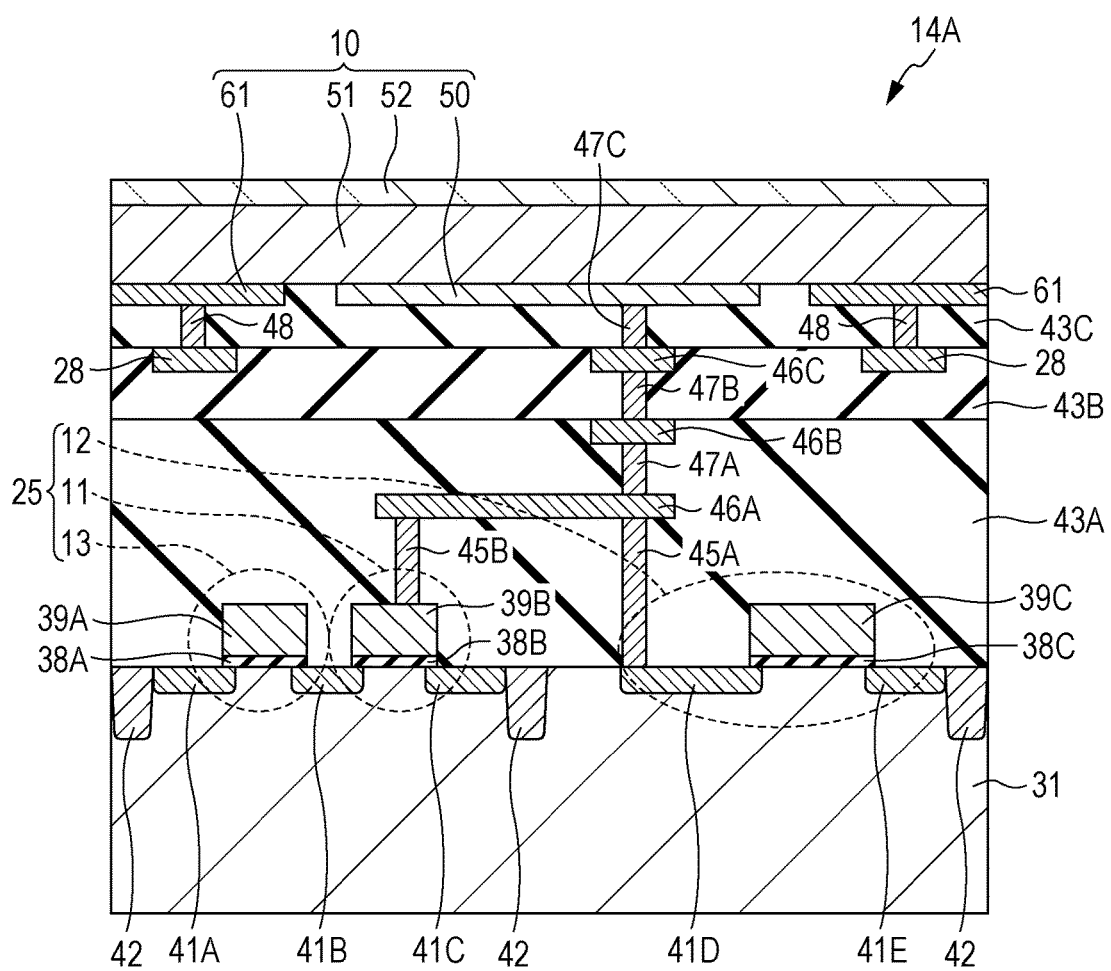
FIG. 2 is a schematic cross-sectional view showing an exemplary device structure of a pixel cell.

FIG. 2 schematically shows an exemplary device structure of the pixel cell 14A. In the configuration illustrated in FIG. 2, the photoelectric conversion portion 10 is arranged above a semiconductor substrate 31 on which the signal detection transistor 11, the reset transistor 12, and the address transistor 13 are formed. The semiconductor substrate 31 is not limited to a substrate which is wholly made of a semiconductor and may be an insulating substrate having a semiconductor layer provided on a surface where the photosensitive region is to be formed. An example will be described here in which a P-type silicon (Si) substrate is used as the semiconductor substrate 31. Note that the term "above" in the present specification is used to explain the arrangement of members relative to each other and is not intended to limit the posture of an imaging device when used.

The semiconductor substrate 31 includes impurity regions (N-type regions here) 41A to 41E and an element isolation region 42 for electrical separation between the pixel cells 14A. The impurity region 41A functions as one of a source region and a drain region of the address transistor 13. The impurity region 41B functions as the other of the source region and the drain region of the address transistor 13. The impurity region 41A is connected to the vertical signal line 17 (not shown in FIG. 2, but see FIG. 1). A gate insulating layer 38A and a gate electrode 39A are arranged between the impurity regions 41A and 41B.

In the configuration illustrated in FIG. 2, the impurity region 41B also functions as a source region of the signal detection transistor 11. That is, in this example, the address transistor 13 and the signal detection transistor 11 share the impurity region 41B. The signal detection transistor 11 includes the impurity region 41C as a drain region and a gate insulating layer 38B and a gate electrode 39B which are arranged between the impurity regions 41B and 41C. The impurity region 41C is connected to the power line 21 (not shown in FIG. 2, but see FIG. 1).

The impurity region 41D functions as one of a source region and a drain region of the reset transistor 12. The impurity region 41E functions as the other of the source region and the drain region of the reset transistor 12. The element isolation region 42 is provided between the impurity regions 41C and 41D. The impurity region 41E is connected to the feedback line 23 (not shown in FIG. 2, but see FIG. 1). A gate insulating layer 38C and a gate electrode 39C are arranged between the impurity regions 41D and 41E.

In the shown example, the signal detection transistor 11, the reset transistor 12, and the address transistor 13 are covered with interlayer insulating layers 43A to 43C, and the photoelectric conversion portion 10 is arranged on the interlayer insulating layer 43C. The photoelectric conversion portion 10 includes the pixel electrode 50, the auxiliary electrode 61, a counter electrode 52, and a photoelectric conversion layer 51.

In the shown example, the pixel electrode 50 and the auxiliary electrode 61 are arranged in the interlayer insulating layer 43C. The pixel electrode 50 is electrically separated from the pixel electrode 50 of the different adjacent pixel cell 14A typically through spatial separation. The auxiliary electrode 61 is arranged around the pixel electrode 50. In the example, the pixel electrode 50 and the auxiliary electrode 61 are arranged at the same layer. The pixel electrode 50 and the auxiliary electrode 61 are formed of, for example, a polysilicon that is invested with conductivity by being doped with a metal, such as aluminum or copper, or an impurity. The material for the pixel electrode 50 and that for the auxiliary electrode 61 may be the same or different.

As shown in FIG. 2, the counter electrode 52 faces the pixel electrode 50 and the auxiliary electrode 61. The counter electrode 52 is a transparent electrode which is formed using a conductive transparent material, such as ITO. The counter electrode 52 is connected to the above-described storage control line 16 (see FIG. 1). Thus, the counter electrode 52 is configured such that a predetermined voltage can be applied to the counter electrode 52 when the imaging device 100A is in operation. Note that the term "transparent" in the present specification refers to capable of transmitting at least part of light within a wavelength range as a detection target, and transmitting light within the entire wavelength range (for example, not less than 380 nm and not more than 780 nm) of visible light is not necessarily required. In the present specification, electromagnetic waves in general including infrared rays and ultraviolet rays will be described as "light" for convenience sake. A microlens, a color filter, and the like can be arranged on the counter electrode 52.

The photoelectric conversion layer 51 is arranged between the counter electrode 52, and the pixel electrode 50 and the auxiliary electrode 61. Light incident on the imaging device 100A comes incident on the photoelectric conversion layer 51 via the counter electrode 52. The photoelectric conversion layer 51 is formed of an organic material or an inorganic material, such as amorphous silicon. The photoelectric conversion layer 51 may include a layer made of an organic material and a layer made of an inorganic material. The photoelectric conversion layer 51 irradiated with light generates an electron-hole pair.

Control of the potential of the counter electrode 52 via the storage control line 16 allows the pixel electrode 50 to collect one of positive and negative charges generated by photoelectric conversion as a signal charge. For example, if a positive hole is used as a signal charge, the potential of the counter electrode 52 may be made higher than that of the pixel electrode 50. An example will be described below in which a positive hole is used as a signal charge. Of course, an electron may also be used as a signal charge.

Charges collected by the pixel electrode 50 are stored in a charge storage region including the charge storage node 24 (see FIG. 1). In the example shown in FIG. 2, the pixel electrode 50 is electrically connected to the impurity region 41D as the drain region or the source region of the reset transistor 12 and the gate electrode 39B of the signal detection transistor 11 via pieces 46A to 46C of wiring, plugs 47A to 47C, and contact plugs 45A and 45B. The pixel electrode 50, the pieces 46A to 46C of wiring, the plugs 47A to 47C, the contact plugs 45A and 45B, the impurity region 41D, and the gate electrode 39B constitute the charge storage region that stores signal charges. A signal detection circuit 25 which includes, as a part, the signal detection transistor 11 outputs a signal corresponding to the amount of charges stored in the charge storage region. In this example, the signal detection circuit 25 includes the signal detection transistor 11, the reset transistor 12, and the address transistor 13. Note that the peripheral circuit including the vertical scanning circuit 15, the voltage supply circuit 60, the load circuits 18, the column signal processing circuits 19, the inverting amplifiers 22, the horizontal signal read circuit 20, and the like described above may be formed on the semiconductor substrate 31, like the signal detection circuit 25.

In the configuration illustrated in FIG. 2, the auxiliary electrode 61 arranged around the pixel electrode 50 is connected to a piece 28 of wiring, which is provided in the interlayer insulating layer 43B, via a plug 48 which is provided in the interlayer insulating layer 43C. The piece 28 of wiring is connected to either one of the sensitivity adjustment lines 28a and 28b described with reference to FIG. 1. As will be described later, the sensitivity in the pixel cell 14A can be changed by controlling a voltage (hereinafter also referred to as a "sensitivity control voltage") to be applied to the auxiliary electrode 61.

To manufacture the pixel cell 14A in the imaging device 100A, a general semiconductor manufacturing process can be used. Especially if a silicon substrate is used as the semiconductor substrate 31, various silicon semiconductor processes can be used.

(Alteration of Sensitivity Through Sensitivity Adjustment Voltage Control)

Alteration of the sensitivity in the pixel cell 14A through sensitivity adjustment voltage control will be described below by describing an exemplary operation of the imaging device 100A.

Figure 3:
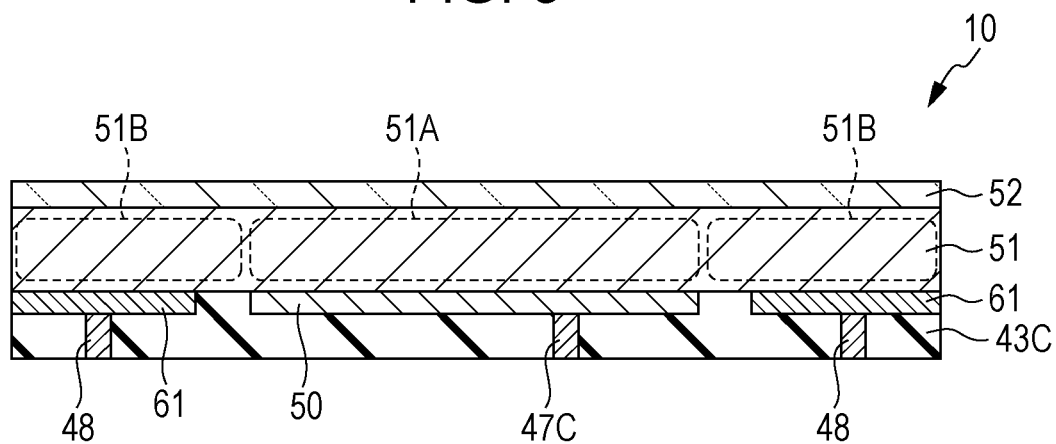
FIG. 3 is a schematic cross-sectional view showing, on an enlarged scale, a photoelectric conversion portion and its vicinity.

FIG. 3 shows, on an enlarged scale, a cross-section of the photoelectric conversion portion 10 and its vicinity. At the time of image acquisition, the potential of the pixel electrode 50 is first reset. Prior to signal charge storage (which may be referred to as exposure), the reset transistor 12 and the address transistor 13 are turned on. After that, the reset transistor 12 and the address transistor 13 are turned off. With the resetting, the potential of the charge storage node 24 including the pixel electrode 50 is set to a reset voltage (for example, 0 V) as an initial value.

Shooting is performed while a bias voltage is applied to the photoelectric conversion layer 51. At the time of signal charge storage, a predetermined voltage (for example, about 10 V) is being applied to the counter electrode 52 via the storage control line 16. Additionally, in the embodiment of the present disclosure, a sensitivity adjustment voltage is applied from the voltage supply circuit 60 to the auxiliary electrode 61. For example, a voltage (for example, −2 V) lower than the reset voltage (0 V here) is applied as the sensitivity adjustment voltage to the auxiliary electrode 61.

After the reset operation, exposure is performed while predetermined voltages are applied to the counter electrode 52 and the auxiliary electrode 61, respectively. As described above, incidence of light causes the photoelectric conversion layer 51 to generate positive and negative charges. The potential (0 V here) of the pixel electrode 50 and the potential (−2 V here) of the auxiliary electrode 61 are set to be lower than the potential (for example, 10 V) of the counter electrode 52 here. For this reason, of the positive and negative charges generated in the photoelectric conversion layer 51 by photoelectric conversion, the positive charges (typically positive holes) move toward a side where the pixel electrode 50 and the auxiliary electrode 61 are arranged. Of the positive charges generated by photoelectric conversion, charges reaching the pixel electrode 50 are collected by the pixel electrode 50. The charges collected by the pixel electrode 50 are detected as signal charges. Meanwhile, charges reaching the auxiliary electrode 61 are collected by the auxiliary electrode 61. The amount of the signal charges collected by the auxiliary electrode 61 is not reflected in a pixel signal.

Figure 4:
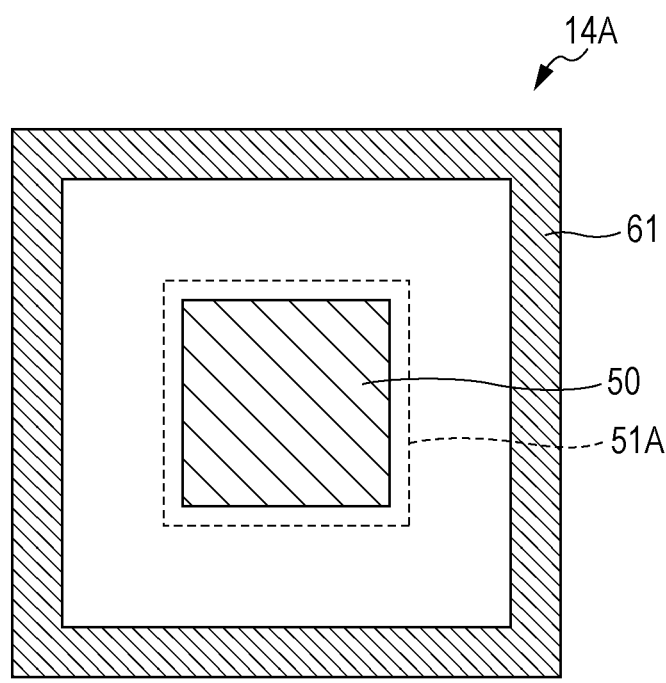
FIG. 4 is a schematic plan view when the photoelectric conversion portion is seen from a normal direction of a semiconductor substrate.

The above means that, of light applied to the photoelectric conversion layer 51, light applied to a region 51A is substantially detected. That is, the pixel cell 14A substantially detects, of light incident on an imaging surface, light incident on the region 51A. The region 51A shown in FIG. 3 is a region of the photoelectric conversion layer 51 where signal charges (for example, positive holes) generated by photoelectric conversion are collected mainly by the pixel electrode 50. A region 51B is a region of the photoelectric conversion layer 51 where signal charges generated by photoelectric conversion are collected mainly by the auxiliary electrode 61. In the example described here, a difference (12 V) in potential between the auxiliary electrode 61 and the counter electrode 52 is larger than a difference (10 V) in potential between the pixel electrode 50 and the counter electrode 52. For this reason, generated positive charges are more likely to move toward the auxiliary electrode 61 than toward the pixel electrode 50. As a result, positive charges generated in the region 51A of the photoelectric conversion layer 51 that overlaps with the pixel electrode 50 move mainly to the pixel electrode 50 and are detected as signal charges. Meanwhile, positive charges generated in the region 51B of the photoelectric conversion layer 51 that overlaps with the auxiliary electrode 61 move mainly toward the auxiliary electrode 61 and are collected by the auxiliary electrode 61. Note that a part of the auxiliary electrode 61 which is between two pixel cells functions as a screening electrode which prevents color mixing between adjacent pixel cells FIG. 4 schematically shows the photoelectric conversion portion 10 when seen from a normal direction of the semiconductor substrate 31. In FIG. 4, the region 51A when the sensitivity adjustment voltage of −2 V is applied to the auxiliary electrode 61 is schematically indicated by a broken line. In the example shown in FIG. 4, the region 51A has a first area slightly larger than the area of the pixel electrode 50 on a plane parallel to the photoelectric conversion layer 51. As shown in FIG. 4, the shape and area of the region 51A when seen from a normal direction of the imaging surface do not necessarily coincide with those of the pixel electrode 50. As will be described later, the shape and/or the area of the region 51A can vary depending on a combination of respective voltages to be applied to the pixel electrode 50, the auxiliary electrode 61, and the counter electrode 52. The shape and area of the region 51B when seen from the normal direction of the imaging surface do not necessarily coincide with those of the auxiliary electrode 61. FIG. 4 schematically shows the region 51A, and there is no definite line of demarcation between the regions 51A and 51B.

Assume that a voltage higher than −2 V is applied as the sensitivity adjustment voltage to the auxiliary electrode 61. For example, assume a case where a voltage (for example, 5 V) lower than the voltage (10 V here) to be applied to the counter electrode 52 and higher than the reset voltage (0 V here) is applied to the auxiliary electrode 61.

Figure 5:
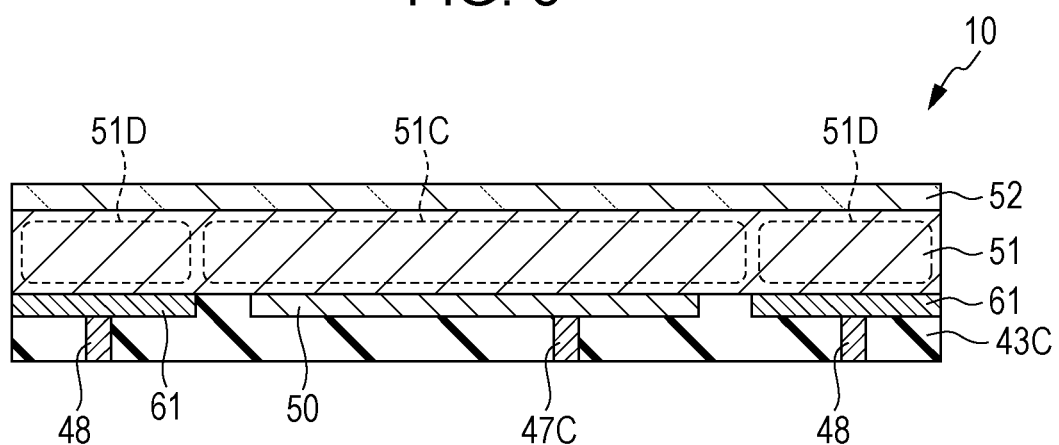
FIG. 5 is a schematic cross-sectional view showing, on an enlarged scale, the photoelectric conversion portion and its vicinity after a sensitivity adjustment voltage is changed in the state shown in FIG. 3.
Figure 6:
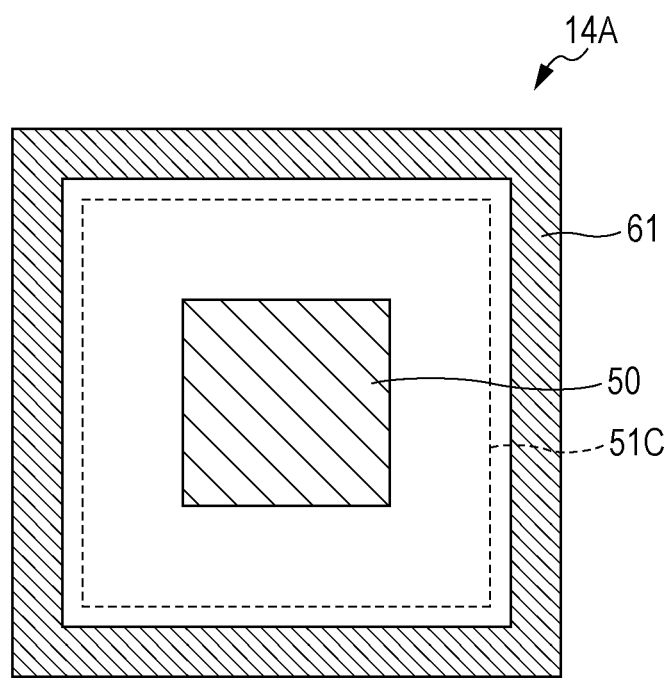
FIG. 6 is a schematic plan view when the photoelectric conversion portion shown in FIG. 5 is seen from the normal direction of the semiconductor substrate.

FIG. 5 shows, on an enlarged scale, a cross-section of the photoelectric conversion portion 10 and its vicinity when the sensitivity adjustment voltage of 5 V is applied to the auxiliary electrode 61. FIG. 6 schematically shows the photoelectric conversion portion 10 in a state where the sensitivity adjustment voltage of 5 V is applied to the auxiliary electrode 61 when seen from the normal direction of the semiconductor substrate 31.

The present example is the same as the example described with reference to FIGS. 3 and 4 in that positive charges generated in the photoelectric conversion layer 51 by photoelectric conversion move toward the auxiliary electrode 61 and the pixel electrode 50. Note that since the sensitivity adjustment voltage (5 V here) is set to be higher than the reset voltage (0 V here) in the example, positive charges generated at the photoelectric conversion layer 51 are more likely to move toward the pixel electrode 50 than toward the auxiliary electrode 61. For this reason, the amount of positive charges flowing into the auxiliary electrode 61 is smaller than in the example described with reference to FIGS. 3 and 4. As a result, as schematically shown in FIGS. 5 and 6, a region 51C where positive charges movable to the pixel electrode 50 are distributed is larger than the region 51A when the sensitivity adjustment voltage of −2 V is applied to the auxiliary electrode 61. The region 51C, for example, has a second area larger than the first area on the plane parallel to the photoelectric conversion layer 51. A region 51D where positive charges movable to the auxiliary electrode 61 are distributed is smaller than the region 51B when the sensitivity adjustment voltage of −2 V is applied to the auxiliary electrode 61.

As described above, the size of a region (the region 51A or 51C) where signal charges are captured by the pixel electrode 50 can be changed by varying the sensitivity adjustment voltage. In other words, the same effects as those obtained when a light-receiving region in the pixel cell 14A is varied are obtained by varying the sensitivity adjustment voltage. That is, the sensitivity of the pixel cell 14A can be changed by varying the sensitivity adjustment voltage. As can be seen from comparison between FIGS. 3 and 4 and FIGS. 5 and 6, the sensitivity of the pixel cell 14A when the sensitivity adjustment voltage of −2 V is applied to the auxiliary electrode 61 is lower than the sensitivity when the sensitivity adjustment voltage of 5 V is applied to the auxiliary electrode 61.

Figure 7:
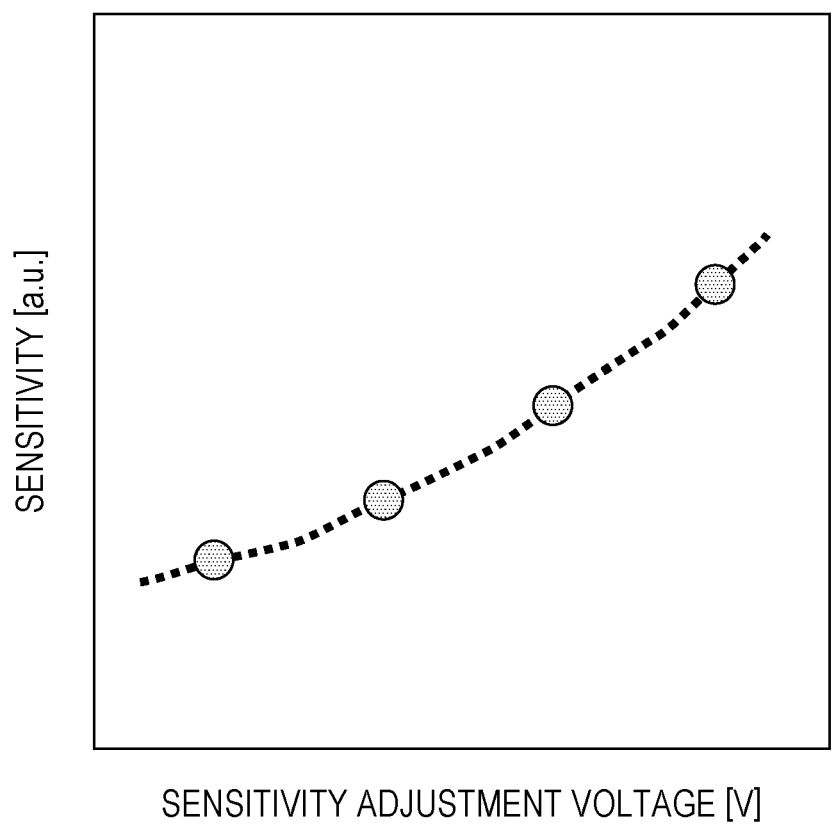
FIG. 7 is a graph schematically showing the relationship between a sensitivity adjustment voltage and the sensitivity of a pixel cell in a case where a signal charge is a positive hole.

FIG. 7 schematically shows the relationship between a sensitivity adjustment voltage and the sensitivity of the pixel cell 14A in a case where a signal charge is a positive hole. As shown in FIG. 7, the sensitivity of the pixel cell 14A changes in response to a change in the sensitivity adjustment voltage. For example, if the sensitivity adjustment voltage is increased, the sensitivity increases. As described above, the first embodiment of the present disclosure allows implementation of provision of the imaging device 100A having the variable-sensitivity pixel cells 14A.

Additionally, in the first embodiment of the present disclosure, first pixel cells connected to the sensitivity adjustment line 28a and second pixel cells connected to the sensitivity adjustment line 28b are arranged in the photosensitive region. It is thus possible to, for example, apply respective sensitivity adjustment voltages different from each other to the first pixel cells and the second pixel cells. That is, investment of respective different sensitivities to the first pixel cells and the second pixel cells can be relatively easily implemented. A common sensitivity adjustment voltage can, of course, be applied to the first pixel cells and the second pixel cells. An example of mode switching in the imaging device 100A through sensitivity adjustment voltage control will be described below.

(Mode Switching in Imaging Device 100A)

Figure 8:
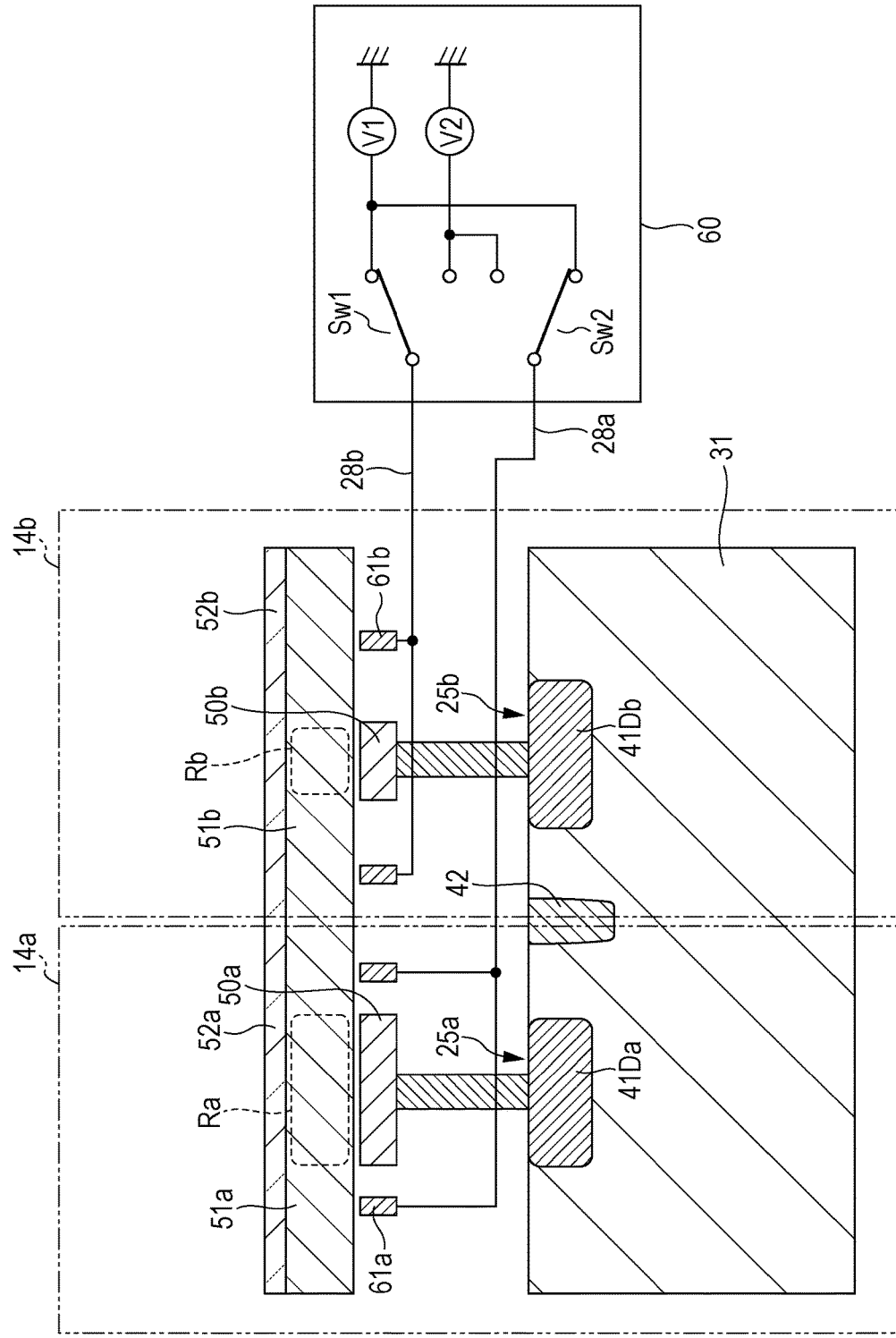
FIG. 8 is a schematic cross-sectional view showing one example of the configuration of a first pixel cell and a second pixel cell in a pixel array of the imaging device.

FIG. 8 schematically shows a cross-section of a first pixel cell and a second pixel cell in the pixel array of the imaging device 100A. A first pixel cell 14a and a second pixel cell 14b shown in FIG. 8 are examples of the above-described pixel cell 14A. FIG. 8 shows a configuration in which the first pixel cell 14a and the second pixel cell 14b are adjacent to each other. The configuration, however, is merely illustrative, and the arrangement of the first pixel cell 14a and the second pixel cell 14b in the pixel array can be arbitrarily set. The total number of first pixel cells 14a and the total number of second pixel cells 14b in the pixel array need not be equal. Note that the signal detection transistor 11 and the like are not shown in FIG. 8 to avoid excessive complication of FIG. 8. Some members may not be shown in the other drawings.

In the example shown in FIG. 8, the device structures of the first pixel cell 14a and the second pixel cell 14b are basically almost the same as the device structure described with reference to FIG. 2. That is, the first pixel cell 14a includes a pixel electrode 50a, an auxiliary electrode 61a, a counter electrode 52a, a photoelectric conversion layer 51a, and a first signal detection circuit 25a. In FIG. 8, an impurity region 41Da which functions as the drain region or the source region of the reset transistor 12 (see FIG. 2) is shown as a part of the first signal detection circuit 25a. As described above, the impurity region 41Da is electrically connected to the pixel electrode 50a. The auxiliary electrode 61a of the first pixel cell 14a is connected to the sensitivity adjustment line 28a. Meanwhile, the second pixel cell 14b includes a pixel electrode 50b, an auxiliary electrode 61b, a counter electrode 52b, a photoelectric conversion layer 51b, and a second signal detection circuit 25b. The second signal detection circuit 25b includes, as a part, an impurity region 41Db which is electrically connected to the pixel electrode 50b. The auxiliary electrode 61b is connected to the sensitivity adjustment line 28b. As described with reference to FIG. 1, the sensitivity adjustment lines 28a and 28b are connected to the voltage supply circuit 60.

In the configuration illustrated in FIG. 8, the counter electrode 52a of the first pixel cell 14a and the counter electrode 52b of the second pixel cell 14b are parts of a single continuous electrode. As described above, the counter electrodes 52a and 52b need not be separate from each other. A common voltage can be applied to a plurality of first pixel cells 14a and a plurality of second pixel cells 14b at a time by forming a counter electrode (the counter electrodes 52a and 52b here) over a plurality of pixel cells, as shown in FIG. 8. Of course, if a desired voltage can be applied via the storage control line 16, counter electrodes of two pixel cells adjacent to each other may be spatially separate from each other. For example, the counter electrodes 52a and 52b may be spatially separate.

The photoelectric conversion layer 51a of the first pixel cell 14a and the photoelectric conversion layer 51b of the second pixel cell 14b constitute parts of a single continuous photoelectric conversion layer here. Obviously, for example, photoelectric conversion layers of two pixel cells adjacent to each other may be spatially separate from each other. In FIG. 8, a region Ra indicated by a broken line schematically represents a region where signal charges generated by photoelectric conversion are collected mainly by the pixel electrode 50a, and a region Rb schematically represents a region where signal charges generated by photoelectric conversion are collected mainly by the pixel electrode 50b.

The pixel electrode 50a, the auxiliary electrode 61a, the pixel electrode 50b, and the auxiliary electrode 61b are arranged at the same layer here. Thus, the pixel electrode 50a, the auxiliary electrode 61a, the pixel electrode 50b, and the auxiliary electrode 61b can be collectively formed by, for example, adopting a common material for the electrodes.

Figure 9:
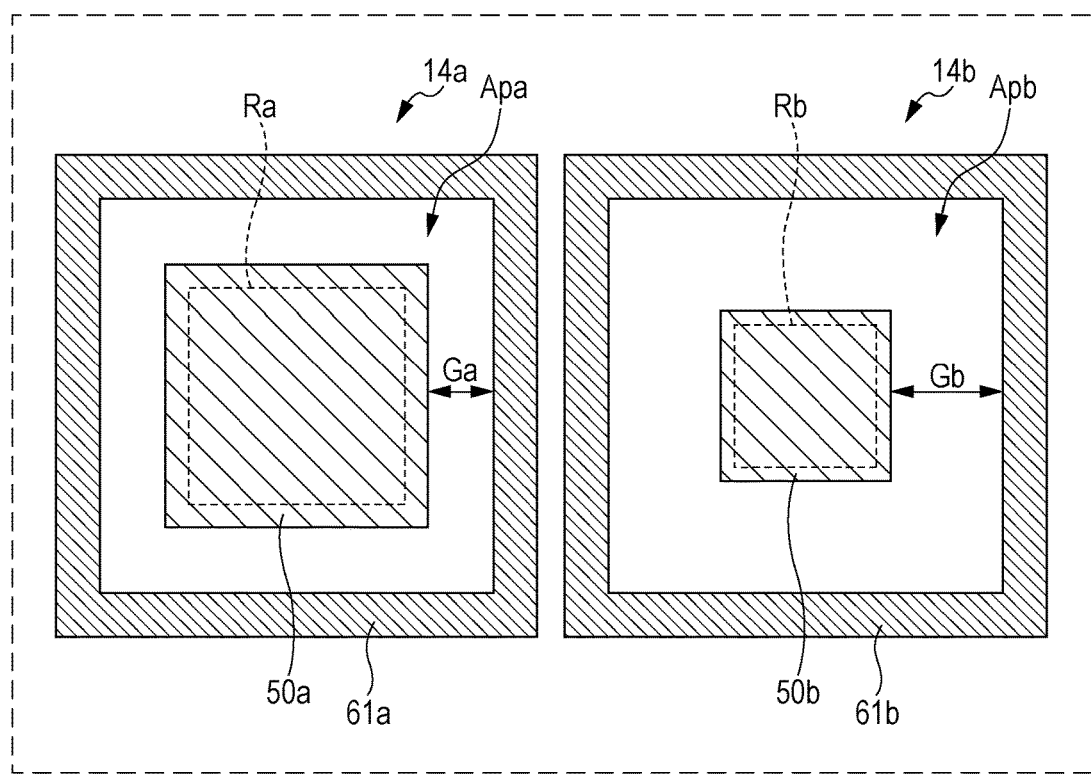
FIG. 9 is a schematic plan view showing one example of the arrangement of pixel electrodes and auxiliary electrodes when the first pixel cell and the second pixel cell shown in FIG. 8 are seen from the normal direction of the semiconductor substrate.

FIG. 9 shows one example of the arrangement of the pixel electrode 50a, the auxiliary electrode 61a, the pixel electrode 50b, and the auxiliary electrode 61b when seen from the normal direction of the semiconductor substrate 31. In the configuration illustrated in FIG. 9, the auxiliary electrode 61a has an opening portion Apa at the center, and the pixel electrode 50a is arranged inside the opening portion Apa. In other words, the auxiliary electrode 61a is arranged around the pixel electrode 50a so as to surround the pixel electrode 50a. A void having a dimension Ga is formed between the auxiliary electrode 61a and the pixel electrode 50a. Similarly, in the example shown in FIG. 9, the auxiliary electrode 61b has an opening portion Apb at the center, and the pixel electrode 50b is arranged inside the opening portion Apb. A void having a dimension Gb is formed between the auxiliary electrode 61b and the pixel electrode 50b. In the example, a minimum value of the distance Ga between the auxiliary electrode 61a and the pixel electrode 50a is smaller than a minimum value of the distance Gb between the auxiliary electrode 61b and the pixel electrode 50b.

Note that there is no definite line of demarcation between a plurality of pixel cells on an imaging surface. Note that each pixel cell can be regarded as a region corresponding to the outer shape of an auxiliary electrode in a case as shown in FIG. 9 where an auxiliary electrode (for example, the auxiliary electrode 61a) is arranged around a pixel electrode (for example, the pixel electrode 50a). In the example, the sizes of the auxiliary electrodes 61a and 61b are almost the same, and the sizes of the first pixel cell 14a and the second pixel cell 14b are thus almost the same. The sizes of the auxiliary electrodes 61a and 61b may, of course, be different from each other.

As shown in FIG. 9, in the example described here, the electrode area of the pixel electrode 50a of the first pixel cell 14a is larger than the electrode area of the pixel electrode 50b of the second pixel cell 14b. The term "electrode area" in the present specification refers to the area of an electrode when seen from a normal direction of a substrate (the semiconductor substrate 31 here) supporting the photoelectric conversion portion 10. Note that a normal direction of a principal plane of the photoelectric conversion layer 51 is typically substantially parallel to the normal direction of the substrate.

Refer back to FIG. 8. In the configuration illustrated in FIG. 8, the voltage supply circuit 60 includes switches Sw1 and Sw2 and a voltage source for a voltage V1 and a voltage source for a voltage V2. The specific configuration of the voltage supply circuit 60, of course, is not limited to the configuration illustrated in FIG. 8. The voltages V1 and V2 are sensitivity adjustment voltages which satisfy the relationship V1<V2 and are lower than a voltage to be applied to the counter electrodes 52a and 52b. For example, the voltage V1 can be a voltage (for example, −2 V) lower than the reset voltage (for example, 0 V). The voltage V2 can be a voltage (for example, 5 V) higher than the reset voltage.

FIG. 8 shows a state in which the sensitivity adjustment lines 28a and 28b are connected to the voltage source for the voltage V1 via the switches Sw1 and Sw2. Since the sensitivity adjustment lines 28a and 28b are both connected to the voltage source for the voltage V1, the common voltage V1 is supplied to the auxiliary electrode 61a of the first pixel cell 14a and the auxiliary electrode 61b of the second pixel cell 14b. Thus, in the state shown in FIG. 8, a difference in potential between the counter electrode 52a and the auxiliary electrode 61a and a difference in potential between the counter electrode 52b and the auxiliary electrode 61b are equal to each other. Since the reset voltage is typically common to the first pixel cell 14a and the second pixel cell 14b, a difference in potential between the counter electrode 52a and the pixel electrode 50a and a difference in potential between the counter electrode 52b and the pixel electrode 50b are equal to each other. That is, it can be said that, in the state shown in FIG. 8, there is no difference between the first pixel cell 14a and the second pixel cell 14b except for the electrode area of a pixel electrode.

As described above, the electrode area of the pixel electrode 50a is larger than that of the pixel electrode 50b here. For this reason, as schematically shown in FIGS. 8 and 9, the area of the region Ra is larger than that of the region Rb. That is, under the same level of irradiation, the pixel electrode 50a can collect more signal charges than the pixel electrode 50b. In other words, the sensitivity of the first pixel cell 14a is higher than that of the second pixel cell 14b, and the first pixel cell 14a and the second pixel cell 14b can be used as a high-sensitivity cell and a low-sensitivity cell, respectively. As described above, arrangement of a plurality of pixel cells having respective pixel electrodes different in electrode area from each other in a pixel array and application of a common sensitivity adjustment voltage to respective auxiliary electrodes of the plurality of pixel cells allow achievement of a sensitivity ratio, corresponding to the electrode area ratio between the pixel electrodes, between the plurality of pixel cells.

A pixel signal from the first pixel cell 14a as a high-sensitivity cell can be said to be an image signal less prone to blocked up shadows, and a pixel signal from the second pixel cell 14b as a low-sensitivity cell can be said to be an image signal less prone to blown out highlights. Two pieces of image data different in sensitivity can be obtained in shooting a single scene by acquiring a pixel signal from the first pixel cell 14a as a high-sensitivity cell and a pixel signal from the second pixel cell 14b as a low-sensitivity cell via the first signal detection circuit 25a and the second signal detection circuit 25b, respectively. Merging of such two pieces of image data allows formation of an image free from blown out highlights and blocked up shadows of a scene with a high contrast ratio. Formation of such an image is called "high dynamic range imaging". As described above, the embodiment of the present disclosure allows acquisition of image data for high dynamic range imaging without performing shooting a plurality of times. That is, wide-dynamic-range shooting is possible.

According to the first embodiment, since different exposure times need not be adopted for a high-sensitivity cell and a low-sensitivity cell (an electronic shutter need not be operated at different times for a high-sensitivity cell and a low-sensitivity cell) in wide-dynamic-range shooting, two scanning circuits corresponding to a high-sensitivity cell and a low-sensitivity cell need not be provided. Additionally, the sensitivity ratio between a high-sensitivity cell and a low-sensitivity cell can be finely adjusted by finely adjusting respective sensitivity adjustment voltages for a high-sensitivity cell and a low-sensitivity cell.

Additionally, the mode of the imaging device 100A can be switched to the high-resolution mode that allows shooting at a resolution higher than in the wide-dynamic-range mode by changing sensitivity adjustment voltages to be supplied to the auxiliary electrode 61a of the first pixel cell 14a and the auxiliary electrode 61b of the second pixel cell 14b from the state shown in FIG. 8 to another state.

Figure 10:
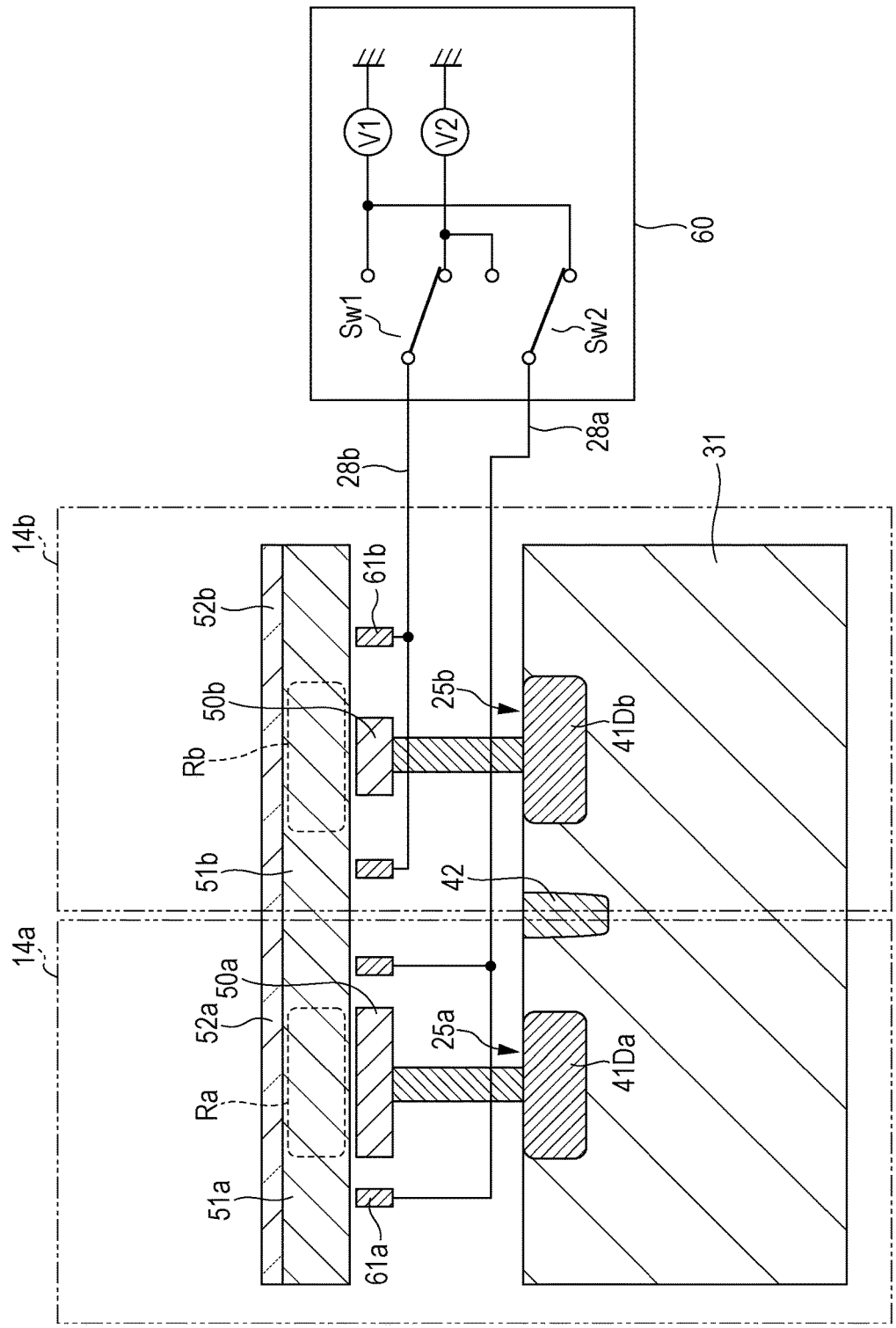
FIG. 10 is diagram for explaining the operation of the imaging device in a high-resolution mode.
Figure 11:
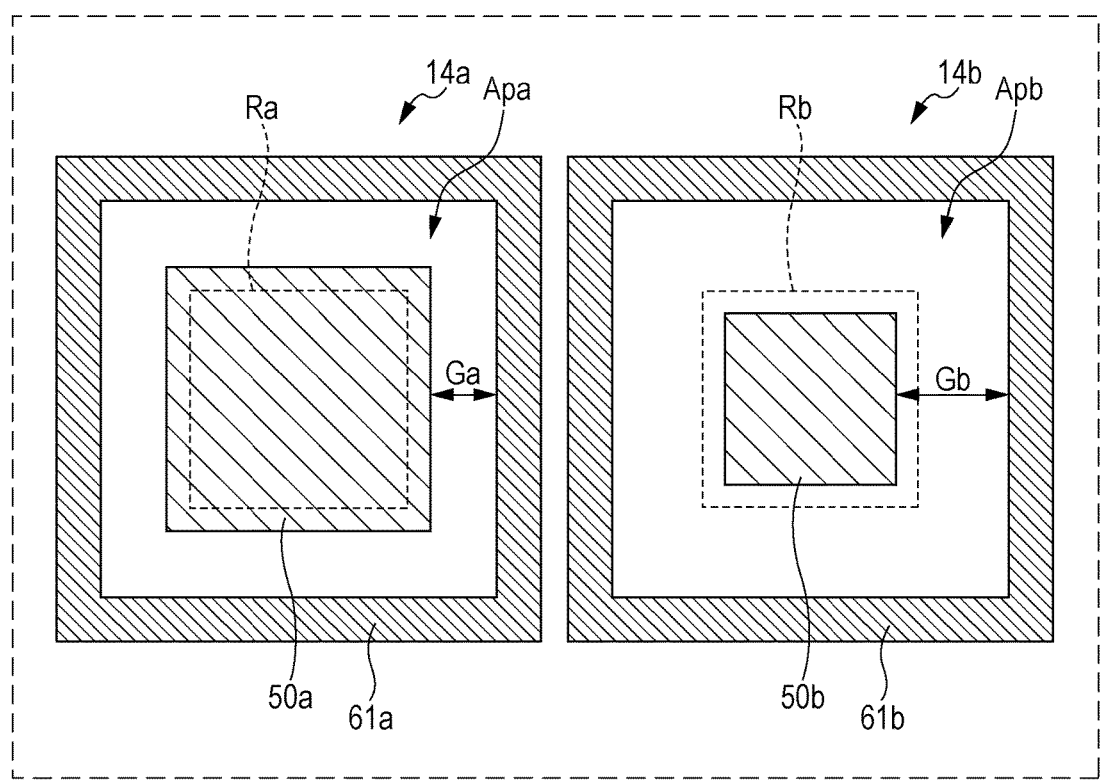
FIG. 11 is a schematic plan view when the photoelectric conversion portion in the state shown in FIG. 10 is seen from the normal direction of the semiconductor substrate.

FIG. 10 is a diagram for explaining the operation of the imaging device 100A in the high-resolution mode. FIG. 11 schematically shows the photoelectric conversion portion 10 in the state shown in FIG. 10 when seen from the normal direction of the semiconductor substrate 31. Respective sensitivity adjustment voltages different from each other can be applied to the auxiliary electrode 61a of the first pixel cell 14a and the auxiliary electrode 61b of the second pixel cell 14b by changing connection of the switch Sw1 from the state shown in FIG. 8 to the state shown in FIG. 10. In this example, the voltages V1 and V2 are applied to the auxiliary electrodes 61a and 61b, respectively, by changing the connection of the switch Sw1.

Focus on the second pixel cell 14b. As compared with the state shown in FIG. 8, a higher sensitivity adjustment voltage (the voltage V2 here) is applied to the auxiliary electrode 61b. Thus, more signal charges (for example, positive holes) are collected by the auxiliary electrode 61b, and, as a result, the region Rb is larger than in the state shown in FIG. 8. That is, the same effects as those obtained when a light-receiving region is expanded are obtained, and the sensitivity of the second pixel cell 14b is higher than in the state shown in FIG. 8. Note that the range of change in the size of a region (the region Rb here) where signal charges are captured by the pixel electrode 50b that can be adjusted by varying the sensitivity adjustment voltage can be increased with an increase in the distance Gb between the pixel electrode 50b and the auxiliary electrode 61b.

In this case, the area of the region Ra in the first pixel cell 14a and the area of the region Rb in the second pixel cell 14b can be made almost equal, as schematically shown in FIG. 11, by appropriately selecting respective values for the voltages V1 and V2 in accordance with an electrode area ratio. That is, the sensitivity in the second pixel cell 14b can be made closer to that in the first pixel cell 14a through sensitivity adjustment voltage control. In this case, the function of the first pixel cell 14a and the function of the second pixel cell 14b can be said to be almost equivalent. Thus, for example, if the number of first pixel cells 14a is equal to the number of second pixel cells 14b in the pixel array, resolution can be made twice that in the wide-dynamic-range mode by narrowing a difference in sensitivity between the first pixel cell 14a and the second pixel cell 14b and making the sensitivities of the first pixel cell 14a and the second pixel cell 14b uniform. As described above, the first embodiment of the present disclosure allows switching between the wide-dynamic-range mode and the high-resolution mode through sensitivity adjustment voltage control.

In the high-resolution mode in the embodiment of the present disclosure, a piece of image data for one frame can be acquired by one shooting operation, as compared with a method adopting different exposure times for a high-sensitivity element and a low-sensitivity element, like the technique described in Japanese Unexamined Patent Application Publication No. 2007-288522. Thus, an exposure time for a low-sensitivity element need not be extended, and a frame rate is not reduced. High-resolution shooting according to the embodiment of the present disclosure is suitable for shooting of an object moving at high speed. Short-exposure pixels and long-exposure pixels are not coexistent in an image obtained by high-resolution shooting according to the embodiment of the present disclosure. This allows inhibition of occurrence of blurring or the like due to coexistence of pixels different in exposure time to inhibit image deterioration. Note that a difference in sensitivity between a high-sensitivity cell and a low-sensitivity cell can also be narrowed by arranging high-sensitivity cells and low-sensitivity cells in a pixel array and selectively amplifying a pixel signal acquired by each low-sensitivity cell using an amplifier circuit. However, such a method amplifies noise in a pixel signal from a low-sensitivity cell, and an S/N ratio decreases. According to the embodiment of the present disclosure, selective amplification of a pixel signal from a low-sensitivity cell is unnecessary, and such a decrease in S/N ratio does not occur.

In the high-resolution mode, for example, a set of the first pixel cell 14a and the second pixel cell 14b adjacent to each other can be used as a set of pixels for phase detection autofocus (AF). That is, a plurality of sets of the first pixel cell 14a and the second pixel cell 14b adjacent to each other can be arranged in the pixel array, and an output from the first pixel cell 14a and an output from the second pixel cell 14b in each set can be used for phase difference detection. The imaging device 100A may include a distance measurement circuit which calculates the distance between the imaging surface and a subject on the basis of outputs from the first pixel cells 14a and outputs from the second pixel cells 14b. Note that the first pixel cell 14a and the second pixel cell 14b as a set used for phase difference detection need not be adjacent to each other in the pixel array.

The set of the first pixel cell 14a and the second pixel cell 14b that functions as pixel cells for phase difference detection in the high-resolution mode is used to acquire pixel signals used for high dynamic range imaging in the wide-dynamic-range mode. Thus, according to the embodiment of the present disclosure, phase difference detection can be performed by effectively using pixel cells in a pixel array without arrangement of pixels used only for phase difference detection on an imaging surface. For example, if the pixel cell 14A (that is, the first pixel cell 14a) connected to the sensitivity adjustment line 28a and the pixel cell 14A (that is, the second pixel cell 14b) connected to the sensitivity adjustment line 28b are alternately arranged along rows and columns of the pixel array, as shown in FIG. 1, the number and positions of sets of the first pixel cell 14a and the second pixel cell 14b used for phase difference detection can be arbitrarily changed in accordance with a shooting scene.

Note that, if wiring is installed such that a sensitivity adjustment voltage independent of and different from one for the auxiliary electrodes 61a of other first pixel cells 14a is applied to the auxiliary electrodes 61a of some first pixel cells 14a in the pixel array and such that a sensitivity adjustment voltage independent of and different from one for the auxiliary electrodes 61b of other second pixel cells 14b is applied to the auxiliary electrodes 61b of the second pixel cells 14b adjacent to the first pixel cells 14a, phase difference detection can also be performed in the wide-dynamic-range mode.

Obviously, a combination of sensitivity adjustment voltages to be supplied to the auxiliary electrode 61a of the first pixel cell 14a and the auxiliary electrode 61b of the second pixel cell 14b is not limited to the above-described examples. Table 1 below shows examples of a combination of the sensitivity adjustment voltages to be supplied to the auxiliary electrode 61a of the first pixel cell 14a and the auxiliary electrode 61b of the second pixel cell 14b.

TABLE 1

| (Electrode area of pixel electrode 50a) ≠ (electrode area of pixel electrode 50b) | Wide-dynamic-range mode | | High-resolution mode | |
|---|---|---|---|---|
| | First pixel cell (high-sensitivity cell) | Second pixel cell (low-sensitivity cell) | First pixel cell | Second pixel cell |
| Pattern 1  | V2      | V2      | V1 (↓) | V2      |
| Pattern 2  | V3 (↑)  | V2      | V1 (↓) | V2      |
| Pattern 3  | V2      | V1 (↓)  | V1 (↓) | V2      |
| Pattern 4  | V3 (↑)  | V1 (↓)  | V1 (↓) | V2      |
| Pattern 5  | V2      | V2      | V2     | V3 (↑)  |
| Pattern 6  | V3 (↑)  | V2      | V2     | V3 (↑)  |
| Pattern 7  | V2      | V1 (↓)  | V2     | V3 (↑)  |
| Pattern 8  | V3 (↑)  | V1 (↓)  | V2     | V3 (↑)  |
| Pattern 9  | V2      | V2      | V1 (↓) | V3 (↑)  |
| Pattern 10 | V3 (↑)  | V2      | V1 (↓) | V3 (↑)  |
| Pattern 11 | V2      | V1 (↓)  | V1 (↓) | V3 (↑)  |
| Pattern 12 | V3 (↑)  | V1 (↓)  | V1 (↓) | V3 (↑)  |

In Table 1, patterns 1 to 4 are voltage application patterns which reduce the sensitivity of the first pixel cell 14*a* by supplying a sensitivity adjustment voltage (the voltage V1 here) relatively lower than the voltage V2 as a reference to the auxiliary electrode 61*a* of the first pixel cell 14*a* to narrow a difference in sensitivity between the first pixel cell 14*a* and the second pixel cell 14*b*, in the high-resolution mode. Note that a down arrow in parentheses in Table 1 means a reduction in sensitivity while an up arrow means an increase in sensitivity.

In pattern 1 in Table 1, the sensitivity adjustment voltage to be supplied to the auxiliary electrode 61*a* of the first pixel cell 14*a* and the sensitivity adjustment voltage to be supplied to the auxiliary electrode 61*b* of the second pixel cell 14*b* are set to a common sensitivity adjustment voltage (the voltage V2 here) in the wide-dynamic-range mode. However, for example, a voltage V3 higher than the voltage V2 may be supplied to the auxiliary electrode 61*a* of the first pixel cell 14*a* in the wide-dynamic-range mode, as indicated in pattern 2. The voltage V3 here is a sensitivity adjustment voltage lower than a voltage to be applied to the counter electrodes 52*a* and 52*b*, like the voltages V1 and V2. Specific values of the voltages V1, V2, and V3 may be appropriately determined in accordance with the electrode structures of the first pixel cell 14*a* and the second pixel cell 14*b*. Since if the voltage V3 is supplied to the auxiliary electrode 61*a* of the first pixel cell 14*a*, the region Ra can be made larger than in a state where the voltage V2 is applied to the auxiliary electrode 61*a*, the sensitivity of the first pixel cell 14*a* is higher than when the voltage V2 is applied to the auxiliary electrode 61*a* of the first pixel cell 14*a*. That is, a difference in the sensitivity of the first pixel cell 14*a* between the wide-dynamic-range mode and the high-resolution mode can be made larger than in pattern 1. Thus, a difference in sensitivity between the first pixel cell 14*a* and the second pixel cell 14*b* in the wide-dynamic-range mode can be made larger.

Like pattern 3, the sensitivity adjustment voltage to be applied to the auxiliary electrode 61*a* of the first pixel cell 14*a* and the sensitivity adjustment voltage to be applied to the auxiliary electrode 61*b* of the second pixel cell 14*b* in one of the wide-dynamic-range mode and the high-resolution mode may be the reverse of those in the other. To interchange the sensitivity adjustment voltage to be applied to the auxiliary electrode 61*a* of the first pixel cell 14*a* and the sensitivity adjustment voltage to be applied to the auxiliary electrode 61*b* of the second pixel cell 14*b* at the time of switching between the two modes, switching from the high-resolution mode to the wide-dynamic-range mode may be performed by, for example, changing a connection destination of the switch Sw1 and a connection destination of the switch Sw2 in the state shown in FIG. 10 (corresponding to the high-resolution mode) to the voltage source for the voltage V1 and the voltage source for the voltage V2, respectively. Alternatively, a combination of sensitivity adjustment voltages which increases the sensitivity of the first pixel cell 14*a* and reduces the sensitivity of the second pixel cell 14*b* in the wide-dynamic-range mode, as in pattern 4, may be adopted.

In Table 1, patterns 5 to 8 are voltage application patterns which increase the sensitivity of the second pixel cell 14*b* by supplying a sensitivity adjustment voltage (the voltage V3 here) relatively higher than the voltage V2 as the reference to the auxiliary electrode 61*b* of the second pixel cell 14*b* to narrow a difference in sensitivity between the first pixel cell 14*a* and the second pixel cell 14*b*, in the high-resolution mode. In Table 1, the row of pattern 5 corresponds to the way the sensitivity adjustment voltages are applied in the wide-dynamic-range mode and in the high-resolution mode in the example described with reference to FIGS. 8 to 11. A voltage application pattern as in patterns 5 to 8 which narrows a difference in sensitivity between a high-sensitivity cell and a low-sensitivity cell in the high-resolution mode by increasing the sensitivity of a low-sensitivity cell is advantageous over a voltage application pattern as in patterns 1 to 4 described above which narrows a difference in sensitivity between a high-sensitivity cell and a low-sensitivity cell in the high-resolution mode by reducing the sensitivity of a high-sensitivity cell because a reduction in frame rate can be curbed. From the viewpoint of widening a difference in the sensitivity of the second pixel cell 14*b* between the wide-dynamic-range mode and the high-resolution mode, pattern 7 among the four patterns can be considered more effective.

In Table 1, patterns 9 to 12 are voltage application patterns which narrow a difference in sensitivity between the first pixel cell 14*a* and the second pixel cell 14*b* using a combination of sensitivity adjustment voltages that reduces the sensitivity of the first pixel cell 14*a* and increases the sensitivity of the second pixel cell 14*b* in the high-resolution mode. In patterns 2 and 7 described above, either one of the sensitivity adjustment voltage to be applied to the auxiliary electrode 61*a* of the first pixel cell 14*a* and the sensitivity adjustment voltage to be applied to the auxiliary electrode 61*b* of the second pixel cell 14*b* is fixed both in the wide-dynamic-range mode and in the high-resolution mode. In contrast, in pattern 12, the sensitivity adjustment voltage to be applied to the auxiliary electrode 61*a* and the sensitivity adjustment voltage to be applied to the auxiliary electrode 61*b* in one of the wide-dynamic-range mode and the high-resolution mode are set to the reverse of those in the other, using the voltage V1 lower than the voltage V2 and the voltage V3 higher than the voltage V2. From the viewpoint of securing a wider dynamic range in the wide-dynamic-range mode, a more potent effect can be expected to be obtained by adopting pattern 12 among patterns 1 to 12 shown in Table 1.

As shown in Table 1, one or both of the sensitivity adjustment voltage to be applied to the auxiliary electrode 61*a* of the first pixel cell 14*a* and the sensitivity adjustment voltage to be applied to the auxiliary electrode 61*b* of the second pixel cell 14*b* may be made to differ between the wide-dynamic-range mode and the high-resolution mode. According to the first embodiment, a relatively high sensitivity ratio (for example, 100:1) can be achieved between a high-sensitivity cell and a low-sensitivity cell in the wide-dynamic-range mode.

In the example described here, a difference in sensitivity is made between the first pixel cell 14a and the second pixel cell 14b in the wide-dynamic-range mode by making the electrode area of the pixel electrode 50a in the first pixel cell 14a and that of the pixel electrode 50b in the second pixel cell 14b different. The present disclosure, however, is not limited to the example. A difference in sensitivity may be made between the first pixel cell 14a and the second pixel cell 14b in the wide-dynamic-range mode by, for example, making the size of the auxiliary electrode 61a and that of the auxiliary electrode 61b different. That is, the first pixel cell 14a and the second pixel cell 14b may be different in size from each other.

Alternatively, the electrode area of the pixel electrode 50a in the first pixel cell 14a and that of the pixel electrode 50b in the second pixel cell 14b may be set to a common electrode area. Table 2 below shows examples of a combination of the sensitivity adjustment voltages to be supplied to the auxiliary electrode 61a of the first pixel cell 14a and the auxiliary electrode 61b of the second pixel cell 14b in a configuration in which the electrode area of the pixel electrode 50a in the first pixel cell 14a and that of the pixel electrode 50b in the second pixel cell 14b are set to a common electrode area.

TABLE 2

| (Electrode area of pixel electrode 50a) = (electrode area of pixel electrode 50b) | Wide-dynamic-range mode | | High-resolution mode | |
|---|---|---|---|---|
| | First pixel cell (high-sensitivity cell) | Second pixel cell (low-sensitivity cell) | First pixel cell | Second pixel cell |
| Pattern 13 | V3 (↑) | V2 | V2 | V2 |
| Pattern 14 | V2 | V1 (↓) | V2 | V2 |
| Pattern 15 | V3 (↑) | V1 (↓) | V2 | V2 |

If the electrode area of the pixel electrode 50a is equal to that of the pixel electrode 50b, it can be said that the first pixel cell 14a and the second pixel cell 14b are substantially no different in device structure except that the first pixel cell 14a and the second pixel cell 14b are configured such that respective sensitivity adjustment voltages different from each other can be independently applied to the auxiliary electrodes 61a and 61b. Thus, if the electrode area of the pixel electrode 50a is equal to that of the pixel electrode 50b, the high-resolution mode can be implemented by setting the sensitivity adjustment voltage to be applied to the auxiliary electrode 61a of the first pixel cell 14a and the sensitivity adjustment voltage to be applied to the auxiliary electrode 61b of the second pixel cell 14b to a common sensitivity adjustment voltage.

Figure 12:
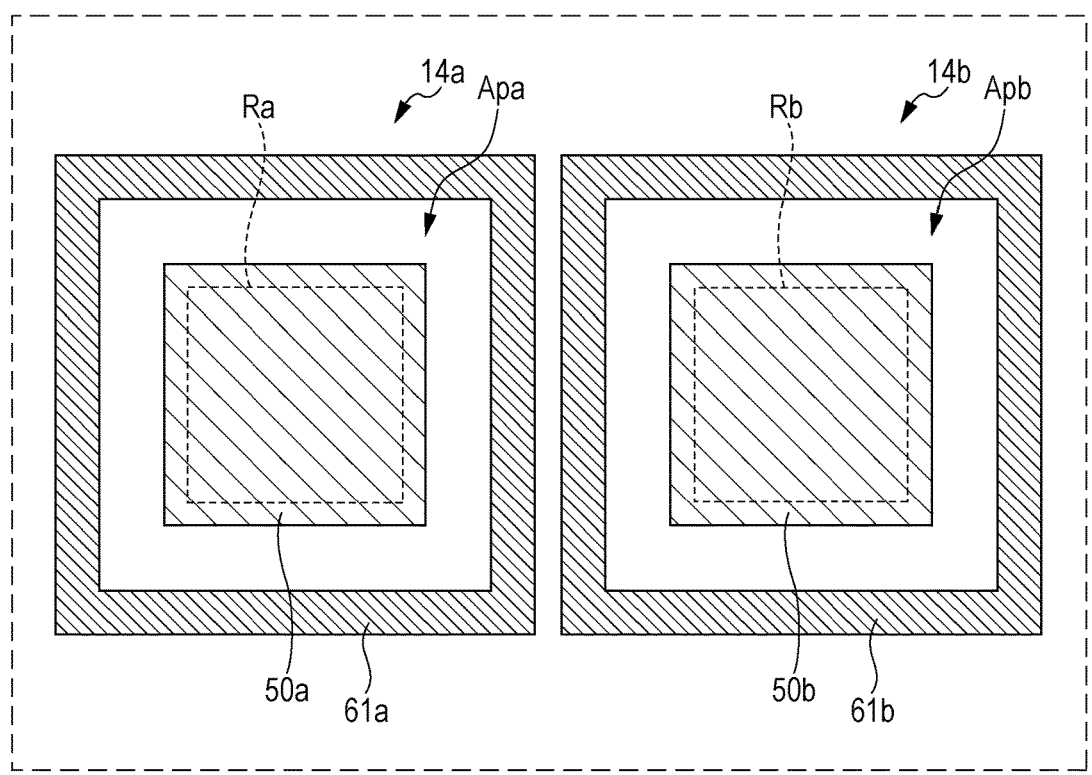
FIG. 12 is a plan view schematically showing the size of a region Ra in a wide-dynamic-range mode, corresponding to pattern 13 in Table 2.
Figure 13:
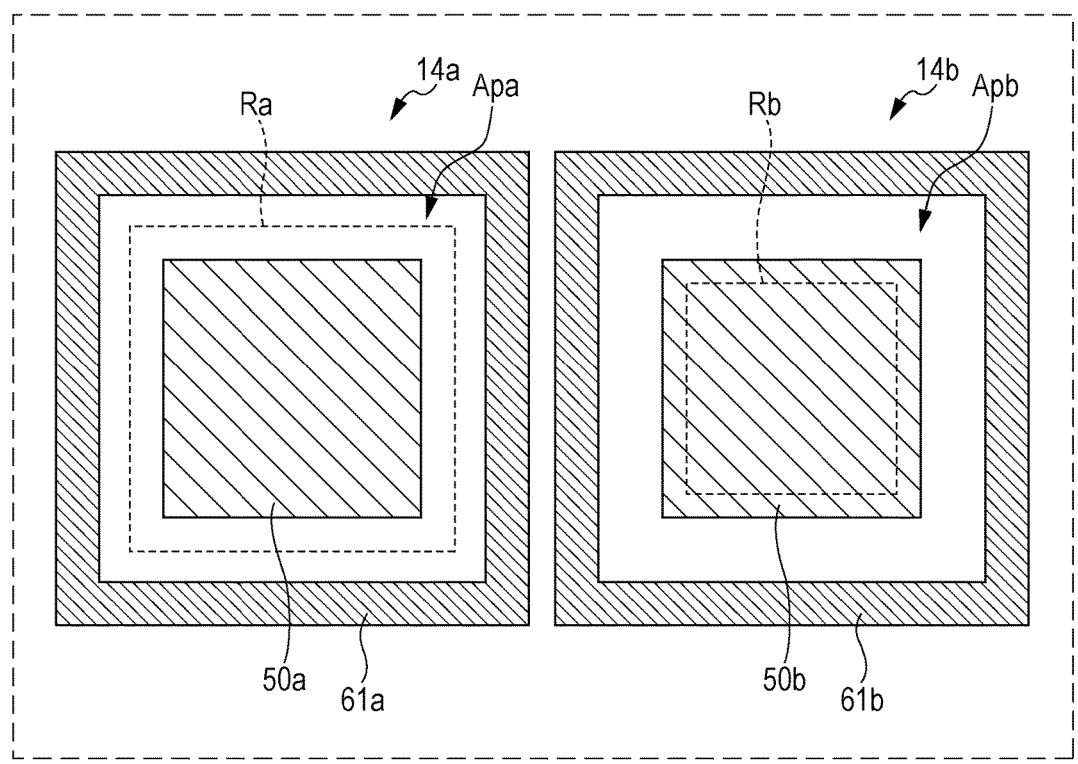
FIG. 13 is a plan view schematically showing the size of the region Ra in the high-resolution mode, corresponding to pattern 13 in Table 2.

In Table 2, pattern 13 makes a difference in sensitivity between the first pixel cell 14a and the second pixel cell 14b in the wide-dynamic-range mode by making the sensitivity adjustment voltage to be applied to the auxiliary electrode 61a of the first pixel cell 14a relatively higher. FIGS. 12 and 13 schematically show the region Ra in the high-resolution mode and the region Ra in the wide-dynamic-range mode, respectively, corresponding to pattern 13 in Table 2. In the state shown in FIG. 12, the area of the region Ra is almost equal to that of the region Rb. In the state shown in FIG. 13, the area of the region Ra is larger than that of the region Rb.

In Table 2, pattern 14 makes a difference in sensitivity between the first pixel cell 14a and the second pixel cell 14b in the wide-dynamic-range mode by making the sensitivity adjustment voltage to be applied to the auxiliary electrode 61b of the second pixel cell 14b relatively lower. Like pattern 15, the sensitivity adjustment voltage to be applied to the auxiliary electrode 61a of the first pixel cell 14a may be made relatively higher and the sensitivity adjustment voltage to be applied to the auxiliary electrode 61b of the second pixel cell 14b may be made relatively lower in the wide-dynamic-range mode than in the high-resolution mode. From the viewpoint of securing a wider dynamic range in the wide-dynamic-range mode, adoption of pattern 15 among patterns 13 to 15 shown in Table 2 is considered more effective.

In the examples shown in FIGS. 8 to 13, the pixel electrode 50a and the auxiliary electrode 61a have rectangular outer shapes. The shapes of the pixel electrode 50a and the auxiliary electrode 61a, however, are not limited to these. For example, the outer shapes of the pixel electrode 50a and the auxiliary electrode 61a may each be a circular shape, an elliptical shape, a polygonal shape, or the like. The outer shape of the pixel electrode 50a and that of the auxiliary electrode 61a need not be the same. In the examples, the auxiliary electrode 61a is formed as a single continuous electrode. The configuration, however, is merely illustrative. For example, the auxiliary electrode 61a may be composed of a plurality of spatially separated sub-auxiliary electrodes. What is said for the pixel electrode 50a and the auxiliary electrode 61a of the first pixel cell 14a also applies to the pixel electrode 50b and the auxiliary electrode 61b of the second pixel cell 14b.

Second Embodiment

Figure 14:
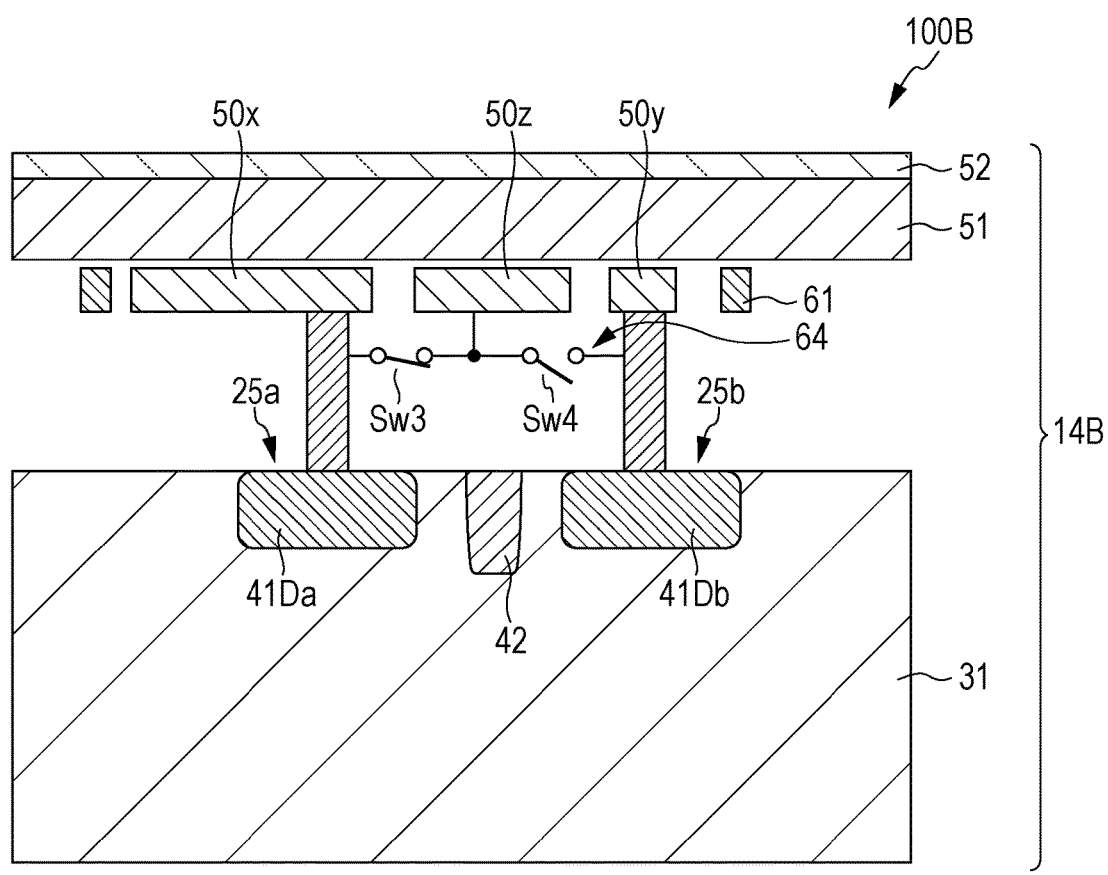
FIG. 14 is a schematic cross-sectional view showing one example of the configuration of a pixel cell in an imaging device according to a second embodiment of the present disclosure.

FIG. 14 schematically shows a cross-section of a pixel cell in an imaging device according to a second embodiment of the present disclosure. An imaging device 100B shown in FIG. 14 includes a plurality of pixel cells 14B. The plurality of pixel cells 14B are arranged, for example, in a matrix in a photosensitive region, like the pixel cells 14A described above. The imaging device 100B is also capable of switching between a wide-dynamic-range mode that allows wide-dynamic-range shooting and a high-resolution mode that allows shooting at a resolution higher than in the wide-dynamic-range mode, like the imaging device 100A described above.

As shown in FIG. 14, the pixel cell 14B includes a photoelectric conversion layer 51 and a counter electrode 52 which faces one of principal surfaces of the photoelectric conversion layer 51. The photoelectric conversion layer 51 and the counter electrode 52 are typically formed to extend over the plurality of pixel cells 14B. The pixel cell 14B includes a first signal detection circuit 25a, a first pixel electrode 50x, a second signal detection circuit 25b, a second pixel electrode 50y, and a third pixel electrode 50z which is arranged between the first pixel electrode 50x and the second pixel electrode 50y. In the example shown in FIG. 14, the first pixel electrode 50x, the second pixel electrode 50y, and the third pixel electrode 50z are arranged at the same layer and are arranged on one of the principal surfaces of the photoelectric conversion layer 51, the one being on the side without the counter electrode 52.

Each of the first signal detection circuit 25a and the second signal detection circuit 25b can have the same configuration as that of the signal detection circuit 25 described with reference to FIG. 2. An impurity region 41Da of the first signal detection circuit 25a which functions as a drain region or a source region of a reset transistor in the first signal detection circuit 25a and an impurity region 41Db of the second signal detection circuit 25b which functions as a drain region or a source region of a reset transistor in the second signal detection circuit 25b are shown here. As shown in FIG. 14, the impurity regions 41Da and 41Db are electrically separated by providing an element isolation region 42 between the impurity regions 41Da and 41Db.

As schematically shown in FIG. 14, the first signal detection circuit 25a is connected to the first pixel electrode 50x, and the second signal detection circuit 25b is connected to the second pixel electrode 50y. Signal charges collected by the first pixel electrode 50x are stored in a charge storage region which includes, as a part, the impurity region 41Da, and a pixel signal corresponding to the amount of stored signal charges is read out via a vertical signal line 17 corresponding to the first signal detection circuit 25a. Similarly, signal charges collected by the second pixel electrode 50y are stored in a charge storage region which includes, as a part, the impurity region 41Db, and a pixel signal corresponding to the amount of stored signal charges is read out via the vertical signal line 17 corresponding to the second signal detection circuit 25b. That is, the pixel cell 14B is connected to the two vertical signal lines 17. One of the two vertical signal lines 17 outputs a signal corresponding to signal charges collected by the first pixel electrode 50x, and the other vertical signal line 17 outputs a signal corresponding to signal charges collected by the second pixel electrode 50y.

As shown in FIG. 14, the pixel cell 14B further includes a switching circuit 64. The switching circuit 64 is configured to be capable of switching between electrical connection of the third pixel electrode 50z to the first pixel electrode 50x and electrical connection of the third pixel electrode 50z to the second pixel electrode 50y.

The switching circuit 64 typically includes one or more switching elements. In the configuration illustrated in FIG. 14, the switching circuit 64 includes a switch Sw3 which is connected between the first pixel electrode 50x and the third pixel electrode 50z and a switch Sw4 which is connected between the second pixel electrode 50y and the third pixel electrode 50z. The switching circuit 64 switches between electrical connection of the first pixel electrode 50x and the third pixel electrode 50z and electrical connection of the second pixel electrode 50y and the third pixel electrode 50z by turning on and off the switches Sw3 and Sw4. The switches Sw3 and Sw4 are typically field effect transistors which are formed on a semiconductor substrate 31. The switches Sw1 to Sw4 according to the present disclosure, of course, are not limited to field effect transistors. Note that the switches Sw3 and Sw4 are shown in FIG. 14 using circuit symbols for convenience sake to avoid excessive complication of FIG. 14. FIG. 14 shows a state in which the third pixel electrode 50z is connected to the first pixel electrode 50x. In this state, the second pixel electrode 50y is electrically separated from the first pixel electrode 50x and the third pixel electrode 50z.

In the example shown in FIG. 14, the pixel cell 14B includes an auxiliary electrode 61 which is arranged around the first pixel electrode 50x, the second pixel electrode 50y, and the third pixel electrode 50z. In the shown example, the auxiliary electrode 61 is arranged at the same layer as the first pixel electrode 50x, the second pixel electrode 50y, and the third pixel electrode 50z. When the imaging device 100B is in operation, a predetermined voltage is supplied to the auxiliary electrode 61. Since the auxiliary electrode 61 is arranged so as to surround the first pixel electrode 50x, the second pixel electrode 50y, and the third pixel electrode 50z, color mixing between the pixel cells 14B adjacent to each other can be inhibited. In the second embodiment, different voltages need not be adopted as respective voltages to be applied to the auxiliary electrode 61 for the wide-dynamic-range mode and the high-resolution mode. The auxiliary electrodes 61 of the plurality of pixel cells 14B may be integrally formed.

Figure 15:
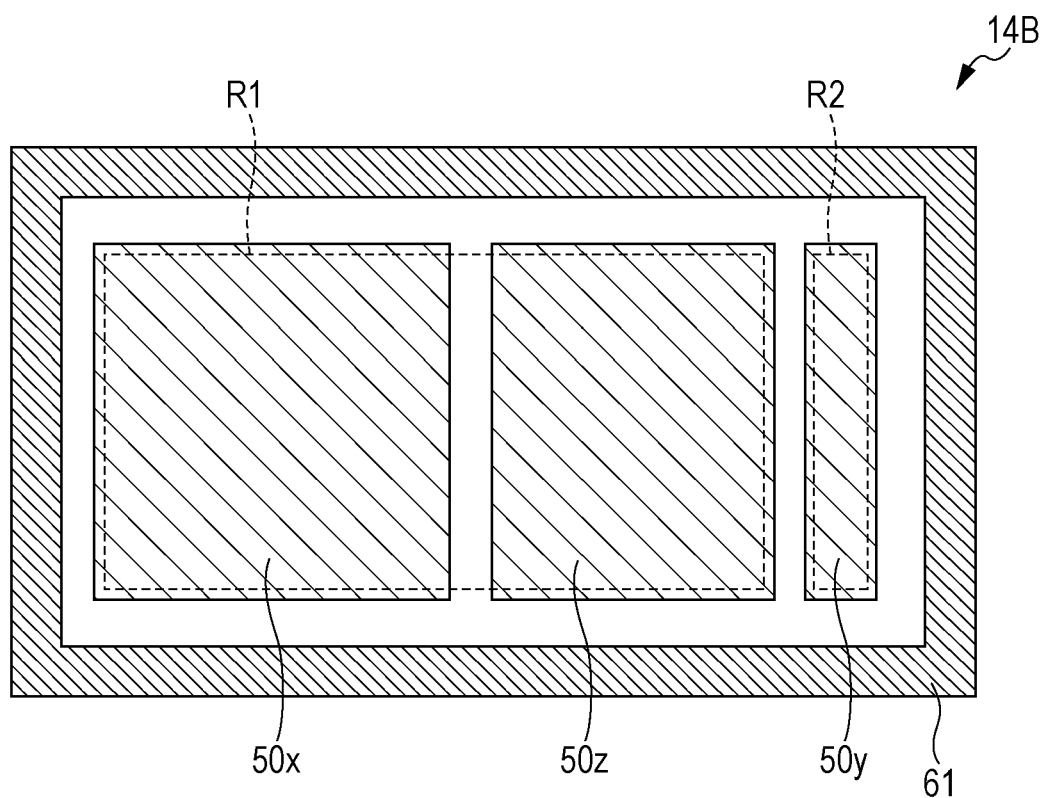
FIG. 15 is a schematic plan view showing one example of the shapes and arrangement of a first pixel electrode, a second pixel electrode, and a third pixel electrode in the pixel cell shown in FIG. 14.

FIG. 15 shows one example of the shapes and arrangement of the first pixel electrode 50x, the second pixel electrode 50y, and the third pixel electrode 50z when seen from a normal direction of the semiconductor substrate 31. FIG. 15 illustrates a configuration in which the electrode area ratio between the first pixel electrode 50x, the second pixel electrode 50y, and the third pixel electrode 50z is set to 5:4:1.

In a state in which the switches Sw3 and Sw4 are turned on and off, respectively, the first pixel electrode 50x and the third pixel electrode 50z are electrically connected. In this state, the ratio between the electrode area (the sum of the electrode area of the first pixel electrode 50x and that of the third pixel electrode 50z here) of an electrode (electrodes) electrically connected to the first signal detection circuit 25a and the electrode area (the electrode area of the second pixel electrode 50y here) of an electrode (electrodes) electrically connected to the second signal detection circuit 25b is 9:1. Thus, under the same level of irradiation, signal charges can be stored in a charge storage region including the first pixel electrode 50x and in a charge storage region including the second pixel electrode 50y in a ratio corresponding to the electrode area ratio. A region R1 indicated by a thick broken line in FIG. 15 schematically represents a region of the photoelectric conversion layer 51 where signal charges (for example, positive holes) generated by photoelectric conversion are collected mainly by the first pixel electrode 50x and the third pixel electrode 50z. A region R2 schematically represents a region where signal charges are collected mainly by the second pixel electrode 50y. The area ratio between the regions R1 and R2 is approximately 9:1.

The same effects as those obtained when two sub-pixel cells different in sensitivity from each other are arranged inside the pixel cell 14B are obtained by arranging the third pixel electrode 50z between the first pixel electrode 50x and the second pixel electrode 50y and connecting the third pixel electrode 50z to the first pixel electrode 50x, as described above. That is, a sub-pixel cell (a left-hand region of the pixel cell 14B here) including the first signal detection circuit 25a can be used as a high-sensitivity cell, and a sub-pixel cell (a right-hand region of the pixel cell 14B here) including the second signal detection circuit 25b can be used as a low-sensitivity cell. Two pieces of image data different in sensitivity can be acquired in shooting of a single scene by individually acquiring an output from the first signal detection circuit 25a and an output from the second signal detection circuit 25b. Like the first embodiment, the present embodiment is capable of wide-dynamic-range shooting.

Figure 16:
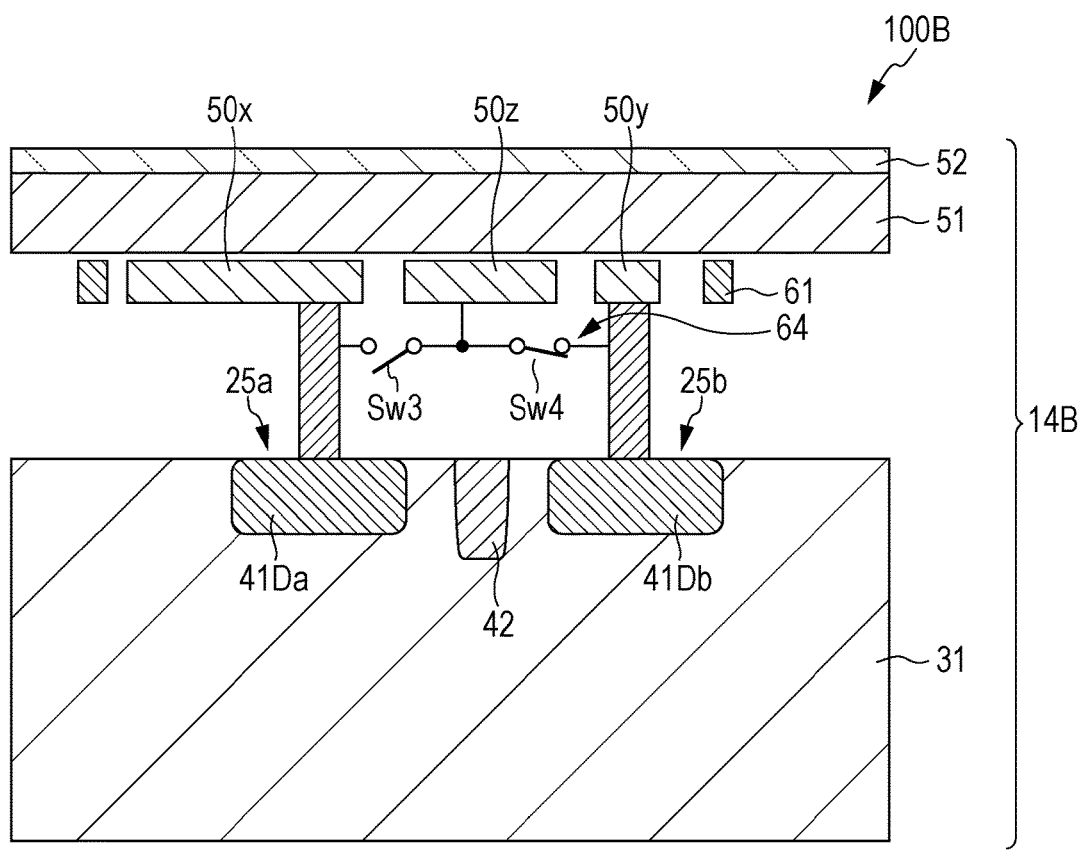
FIG. 16 is a schematic cross-sectional view showing the pixel cell after connection of a switch Sw3 and connection of a switch Sw4 are changed in the state shown in FIG. 14.
Figure 17:
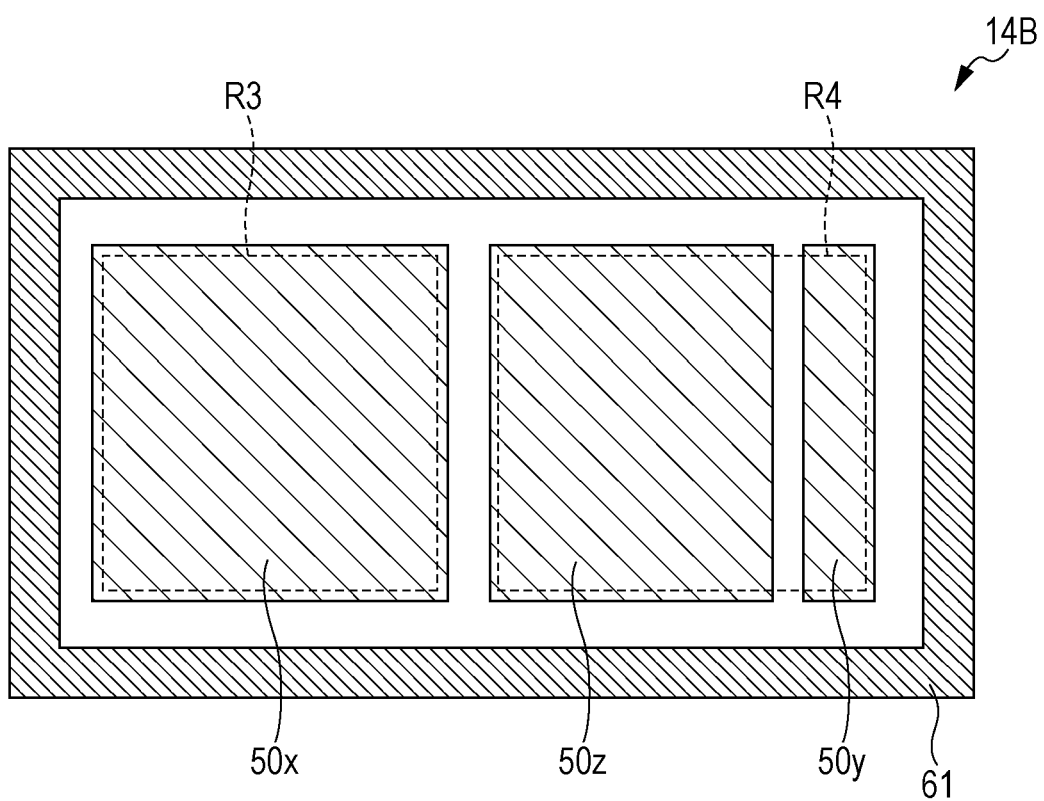
FIG. 17 is a schematic plan view when the pixel cell in the state shown in FIG. 16 is seen from a normal direction of a semiconductor substrate.

FIGS. 16 and 17 schematically show a state after connection of the switch Sw3 and connection of the switch Sw4 are changed in the state shown in FIG. 14. As schematically shown in FIG. 16, it is possible to dissolve the connection between the first pixel electrode 50x and the third pixel electrode 50z and electrically connect the second pixel electrode 50y and the third pixel electrode 50z by turning off and on the switches Sw3 and Sw4, respectively. Since the electrode area ratio between the first pixel electrode 50x, the second pixel electrode 50y, and the third pixel electrode 50z is 5:4:1, the ratio between the electrode area of an electrode (electrodes) (the electrode area of the first pixel electrode 50x here) electrically connected to the first signal detection circuit 25a and the electrode area of an electrode (electrodes) (the sum of the electrode area of the second pixel electrode 50y and that of the third pixel electrode 50z here) electrically connected to the second signal detection circuit 25b is 5:5. That is, the area of a region R3 where signal charges (for example, positive holes) generated by photoelectric conversion are collected mainly by the first pixel electrode 50x and the area of a region R4 where signal charges are collected mainly by the second pixel electrode 50y and the third pixel electrode 50z can be made almost equal. In other words, it is possible to make a difference in sensitivity between a sub-pixel cell (a left-hand region of the pixel cell 14B here) including the first signal detection circuit 25a and a sub-pixel cell (a right-hand region of the pixel cell 14B here) including the second signal detection circuit 25b effectively 0.

In this example, the ratio of the sum of the electrode area of the second pixel electrode 50y and that of the third pixel electrode 50z to the electrode area of the first pixel electrode 50x is almost 1. The ratio of the sum of the electrode area of the second pixel electrode 50y and that of the third pixel electrode 50z to the electrode area of the first pixel electrode 50x is not limited to the example and may be, for example, not less than 0.01 and not more than 1. The lower limit of 0.01 here subsumes a value which can be regarded as substantially 0.01. The upper limit of 1 here subsumes a value which can be regarded as substantially 1.

The same effects as those obtained when two sub-pixel cells equivalent in sensitivity are arranged in the pixel cell 14B are obtained by changing the connection of the switch Sw3 and the connection of the switch Sw4, as described above. Thus, an output from the first signal detection circuit 25a and an output from the second signal detection circuit 25b can be treated as equivalent, and an image having a resolution twice that in the wide-dynamic-range mode is obtained on the basis of the outputs. That is, switching to the high-resolution mode can be implemented by changing the connection of the switch Sw3 and the connection of the switch Sw4.

In the second embodiment, the auxiliary electrode 61 is typically not arranged between the first pixel electrode 50x and the second pixel electrode 50y. Thus, as compared with a configuration in which the auxiliary electrode 61 is arranged between the first pixel electrode 50x and the second pixel electrode 50y, signal charges collected by the auxiliary electrode 61 can be reduced. This allows effective utilization of signal charges generated by photoelectric conversion. Note that the number of third pixel electrodes 50z included in one pixel cell 14B is not limited to 1. The pixel cell 14B can include two or more third pixel electrodes 50z. Variations of a sensitivity ratio can be increased by increasing the number of third pixel electrodes 50z included in one pixel cell 14B. The shapes of the first pixel electrode 50x, the second pixel electrode 50y, and the third pixel electrode 50z are not limited to the shown example.

In the state shown in FIGS. 16 and 17, a pixel signal corresponding to light incident on a left-half region of the pixel cell 14B is output from the first signal detection circuit 25a, and a pixel signal corresponding to light incident on a right-half region of the pixel cell 14B is output from the second signal detection circuit 25b. As described above, in the high-resolution mode, an output from the first signal detection circuit 25a and an output from the second signal detection circuit 25b can be treated as equivalent. Thus, phase difference detection can be performed using an output from the first signal detection circuit 25a and an output from the second signal detection circuit 25b, like the first embodiment. According to the second embodiment, phase difference detection can be performed by effectively using pixel cells in a pixel array, like the first embodiment.

Third Embodiment

Figure 18:
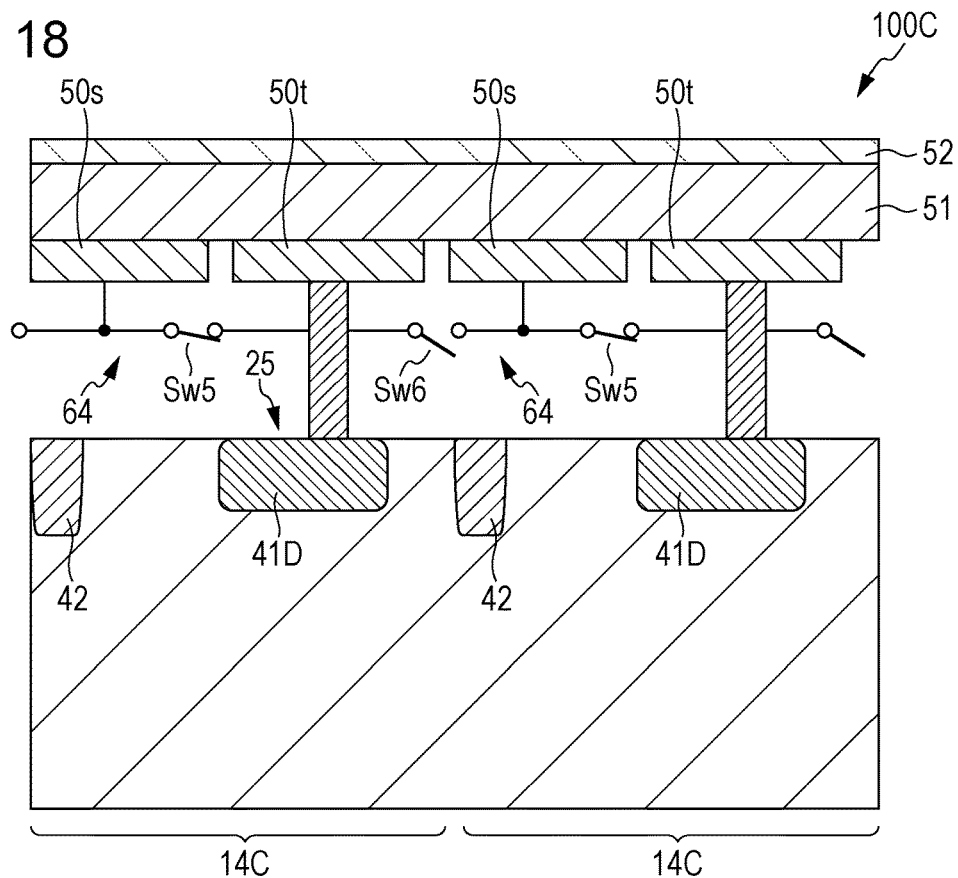
FIG. 18 is a schematic cross-sectional view showing one example of the configuration of a pixel cell in an imaging device according to a third embodiment of the present disclosure.

FIG. 18 schematically shows a cross-section of a pixel cell in an imaging device according to a third embodiment of the present disclosure. An imaging device 100C shown in FIG. 18 includes a plurality of pixel cells 14C. Note that the plurality of pixel cells 14C are arranged, for example, in a matrix in a photosensitive region, like the pixel cells 14A and 14B described above. The imaging device 100C can obtain a higher-resolution image through computation on the basis of images taken in two operating modes.

As shown in FIG. 18, the pixel cell 14C includes a photoelectric conversion layer 51 and a counter electrode 52 which faces one of principal surfaces of the photoelectric conversion layer 51. The photoelectric conversion layer 51 and the counter electrode 52 are typically formed to extend over the plurality of pixel cells 14C. The pixel cell 14C includes a signal detection circuit 25, a first pixel electrode 50s, and a second pixel electrode 50t. In the example shown in FIG. 18, the first pixel electrode 50s and the second pixel electrode 50t are arranged at the same layer and are arranged on one of the principal surfaces of the photoelectric conversion layer 51, the one being on the side without the counter electrode 52.

The signal detection circuit 25 can have the same configuration as that of the signal detection circuit 25 described with reference to FIG. 2. An impurity region 41D which functions as a drain region or a source region of a reset transistor in the signal detection circuit 25 is shown here. As shown in FIG. 18, two adjacent pixel cells 14C are electrically separated by an element isolation region 42.

As schematically shown in FIG. 18, the signal detection circuit 25 is connected to the second pixel electrode 50t. Signal charges collected by the second pixel electrode 50t are stored in a charge storage region which includes, as a part, the impurity region 41D, and a pixel signal corresponding to the amount of stored signal charges is read out via a vertical signal line 17 (not shown in FIG. 18) corresponding to the signal detection circuit 25.

As shown in FIG. 18, the pixel cell 14C further includes a switching circuit 64. The switching circuit 64 is configured to be capable of switching between electrical connection of the first pixel electrode 50s to the second pixel electrode 50t of the same pixel cell 14C and electrical connection of the first pixel electrode 50s to the second pixel electrode 50t within the adjacent pixel cell 14C.

The switching circuit 64 typically includes one or more switching elements. In the configuration illustrated in FIG. 18, the switching circuit 64 includes a switch Sw5 which is connected between the first pixel electrode 50s and the second pixel electrode 50t of the same pixel cell 14C and a switch Sw6 which is connected between the first pixel electrode 50s and the second pixel electrode 50t of the adjacent pixel cell 14C. The switching circuit 64 switches between electrical connection of the first pixel electrode 50s to the second pixel electrode 50t of the same pixel cell 14C and electrical connection of the first pixel electrode 50s to the second pixel electrode 50t of the adjacent pixel cell 14C by turning on and off the switches Sw5 and Sw6. The switches Sw5 and Sw6 are typically field effect transistors which are formed on a semiconductor substrate 31. The switches Sw5 and Sw6 according to the present disclosure, of course, are not limited to field effect transistors. Note that the switches Sw5 and Sw6 are shown in FIG. 18 using circuit symbols for convenience sake to avoid excessive complication of FIG. 18. FIG. 18 shows a state in which the first pixel electrode 50s is connected to the second pixel electrode 50t of the same pixel cell 14C. In this state, the first pixel electrode 50s is electrically separated from the adjacent second pixel electrode 50t.

Figure 19:
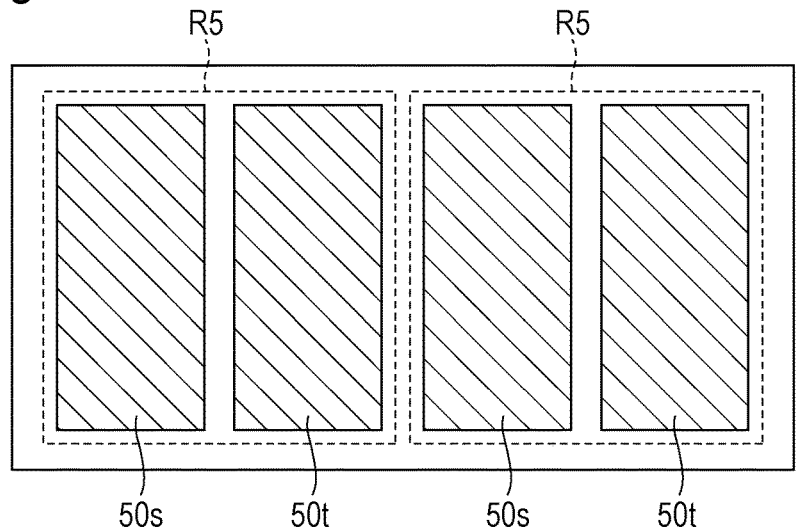
FIG. 19 is a schematic plan view showing one example of the shapes and arrangement of a first pixel electrode and a second pixel electrode in the pixel cell shown in FIG. 18.

FIG. 19 shows one example of the shapes and arrangement of the first pixel electrode 50s and the second pixel electrode 50t when seen from a normal direction of the semiconductor substrate 31. FIG. 19 illustrates a configuration in which the electrode area ratio between the first pixel electrode 50s and the second pixel electrode 50t is set to 1:1.

In a state where the switches Sw5 and Sw6 are turned on and off, respectively, the first pixel electrode 50s and the second pixel electrode 50t of the same pixel cell 14C are electrically connected. In this state, signal charges collected by the first pixel electrode 50s and the second pixel electrode 50t within the same pixel cell 14C are read out by the signal detection circuit 25. A region R5 indicated by a thick broken line in FIG. 19 schematically represents a region of the photoelectric conversion layer 51 where signal charges (for example, positive holes) generated by photoelectric conversion are collected by the first pixel electrode 50s and the second pixel electrode 50t within the same pixel cell 14C.

Figure 20:
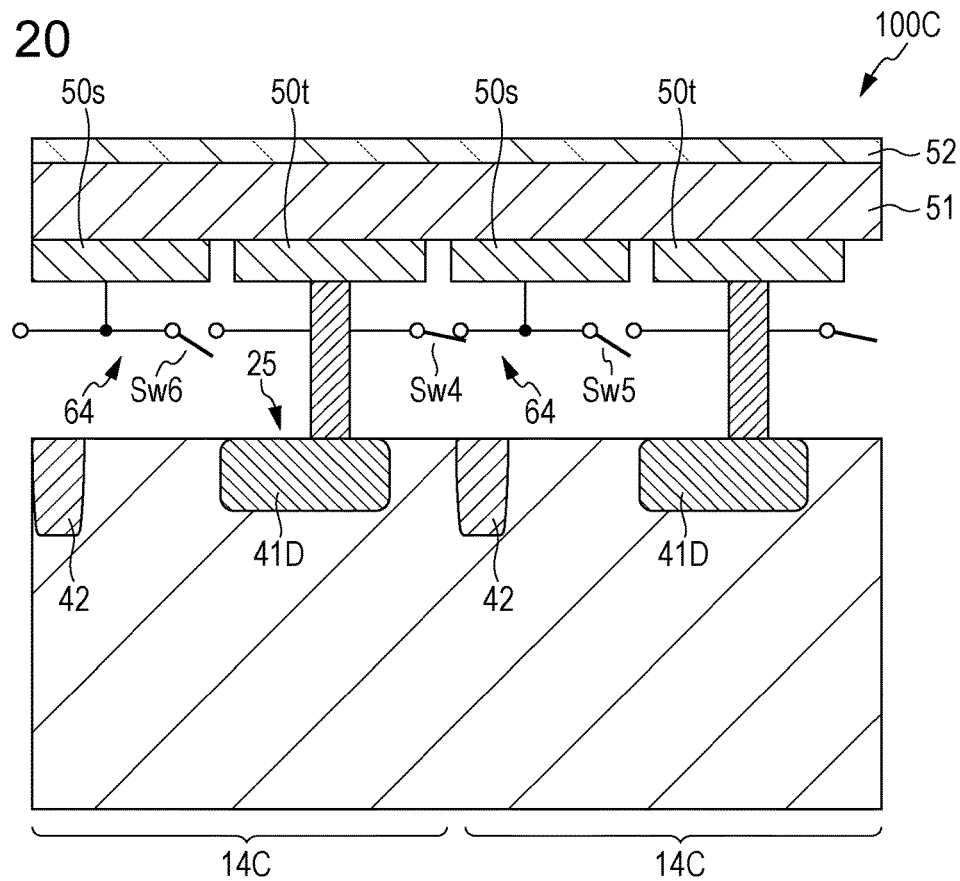
FIG. 20 is a schematic cross-sectional view showing the pixel cell after connection of a switch Sw5 and connection of a switch Sw6 are changed in the state shown in FIG. 18.
Figure 21:
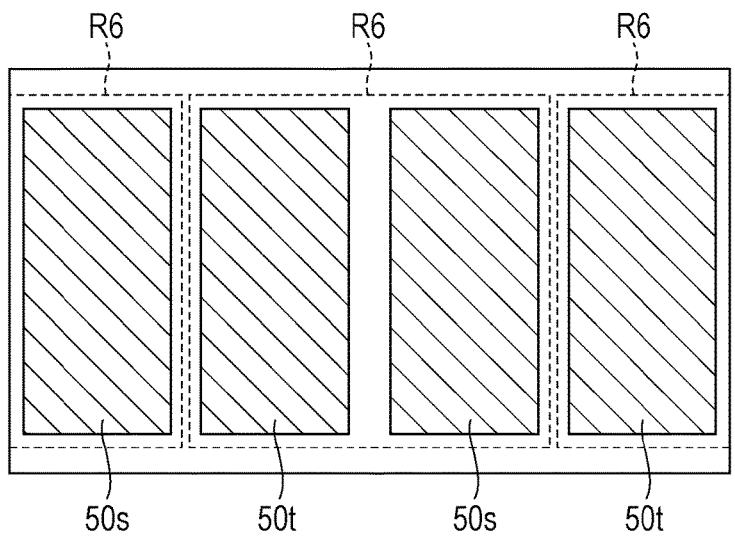
FIG. 21 is a schematic plan view when the pixel cell in the state shown in FIG. 20 is seen from a normal direction of a semiconductor substrate.

FIGS. 20 and 21 schematically show a state after connection of the switch Sw5 and connection of the switch Sw6 are changed in the state shown in FIG. 18. As schematically shown in FIG. 20, it is possible to dissolve the connection between the first pixel electrode 50s and the second pixel electrode 50t within the same pixel cell 14C and electrically connect the second pixel electrode 50t and the first pixel electrode 50s of the adjacent pixel cell 14C by turning off and on the switches Sw5 and Sw6, respectively. In this state, signal charges collected by the second pixel electrode 50t and the first pixel electrode 50s of the adjacent pixel cell 14C are read out by the signal detection circuit 25. A region R6 indicated by a thick broken line in FIG. 21 schematically represents a region of the photoelectric conversion layer 51 where signal charges (for example, positive holes) generated by photoelectric conversion are collected by the second pixel electrode 50t and the first pixel electrode 50s of the adjacent pixel cell 14C.

As can be seen from comparison between FIGS. 19 and 21, the position of a unit pixel of an image is shifted by changing the connection of the switch Sw5 and the connection of the switch Sw6. That is, the region R6 is shifted from the region R5 by a half-pixel in a lateral direction. A higher-resolution image can be obtained through computation by acquiring such images having unit pixel positions shifted from each other.

(First Modification of Third Embodiment)

Figure 22:
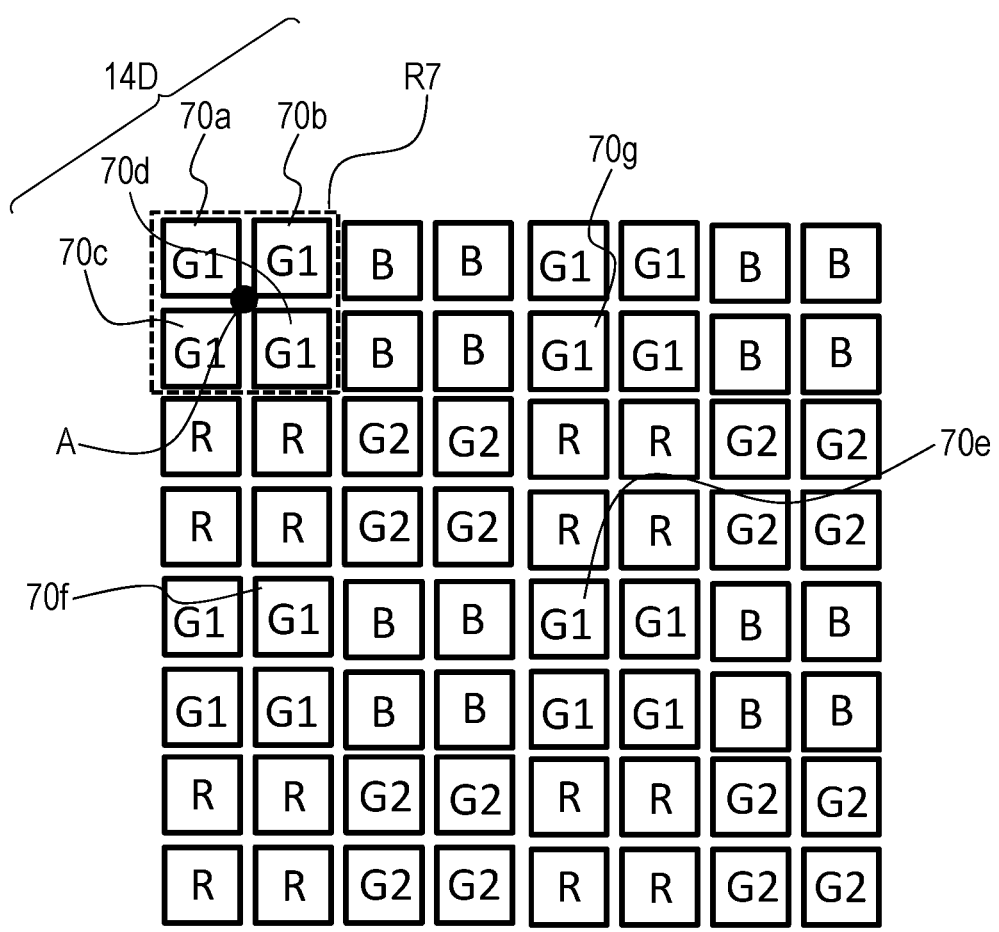
FIG. 22 is a schematic plan view showing one example of the shapes and arrangement of pixel electrodes in an imaging device according to a first modification of the third embodiment of the present disclosure.

FIG. 22 shows the arrangement of pixel electrodes in a color imaging device according to the present modification when seen from a normal direction of the semiconductor substrate 31. As shown in FIG. 22, a pixel cell 14D includes four pixel electrodes in two rows and two columns which are adjacent to one another, and a plurality of pixel cells 14D are arranged in a matrix. Any one of a green filter (G1), a green filter (G2), a blue filter (B), and a red filter (R) is regularly arranged for each pixel 14D.

The cross-section structure of the pixel cell 14D is basically the same as in the third embodiment shown in FIG. 18.

A description of the cross-section structure will be omitted, and differences will be described. The pixel cell 14D includes a signal detection circuit, a first pixel electrode 70a, a second pixel electrode 70b, a third pixel electrode 70c, and a fourth pixel electrode 70d. The signal detection circuit is connected to the fourth pixel electrode 70d.

The pixel cell 14D includes a switching circuit. The switching circuit is configured to be capable of switching between electrical connection of the fourth pixel electrode 70d to the first pixel electrode 70a, the second pixel electrode 70b, and the third pixel electrode 70c within the same pixel cell 14D and electrical connection of the fourth pixel electrode 70d to pixel electrodes 70e, 70f, and 70g of the different pixel cells 14D. More specifically, a switch is provided between the fourth pixel electrode 70d and each of the first pixel electrode 70a, the second pixel electrode 70b, the third pixel electrode 70c, the pixel electrode 70e, the pixel electrode 70f, and the pixel electrode 70g.

Figure 23:
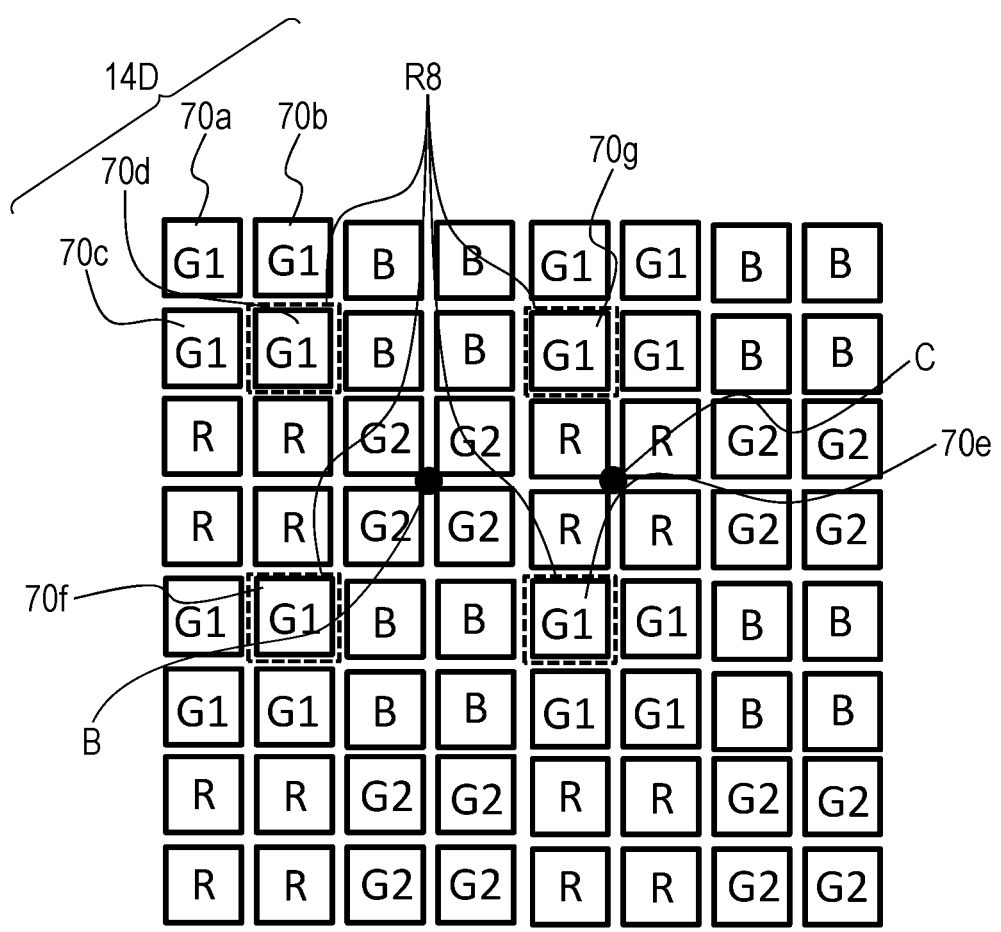
FIG. 23 is a schematic plan view showing the one example of the shapes and arrangement of the pixel electrodes in the imaging device according to the first modification of the third embodiment of the present disclosure.

In a first operating mode, the fourth pixel electrode 70d is electrically connected to the first pixel electrode 70a, the second pixel electrode 70b, and the third pixel electrode 70c within the same pixel cell 14D. In this case, a region R7 indicated by a thick broken line in FIG. 22 is a unit pixel of an image. In a second operating mode, the fourth pixel electrode 70d is electrically connected to the pixel electrodes 70e, 70f, and 70g of the different pixel cells 14D, for which green filters are arranged. In this case, a region R8 indicated by thick broken lines in FIG. 23 is a unit pixel of an image.

The first operating mode and the second operating mode are different in the center position of four pixel electrodes to be connected together. That is, as shown in FIGS. 22 and 23, a center position in the first operating mode is at a point A, and a center position in the second operating mode is at a point B.

In the first operating mode, since a green filter is arranged for the pixel cell 14D, red and blue light signals cannot be directly obtained at the pixel cell 14D. For example, to obtain a piece of blue image information at the position of the pixel cell 14D, a piece of image information of a blue pixel cell located around the pixel cell 14D is extracted, and interpolation is performed using the piece of image information. For example, a piece of blue image information can be interpolated at the pixel cell 14D using, for example, a piece of information of a blue pixel cell which is a right-hand neighbor of the pixel cell 14D or a blue pixel cell which is located obliquely below the pixel cell 14D.

In the present modification, the second operating mode allows acquisition of pieces of image information of each color at positions different from in the first operating mode. For example, a pixel electrode which is located at the bottom right of a blue pixel cell which is a right-hand neighbor of the pixel cell 14D is electrically connected to three pixel electrodes of different blue pixel cells centered around a point C in the second operating mode. With this connection, a piece of blue image information can be obtained at the position of the point C. Thus, interpolation using an additional piece of blue image information obtained in the second operating mode allows finer interpolation of pieces of blue image information than interpolation only in the first operating mode.

As has been described above, in the present modification, two images different in the center position of a unit pixel from each other can be obtained by imaging in the first operating mode and in the second operating mode. Since the images are different in the center position of a unit pixel from each other, an image having an increased resolution can be obtained through computation based on the images.

(Second Modification of Third Embodiment)

Figure 24:
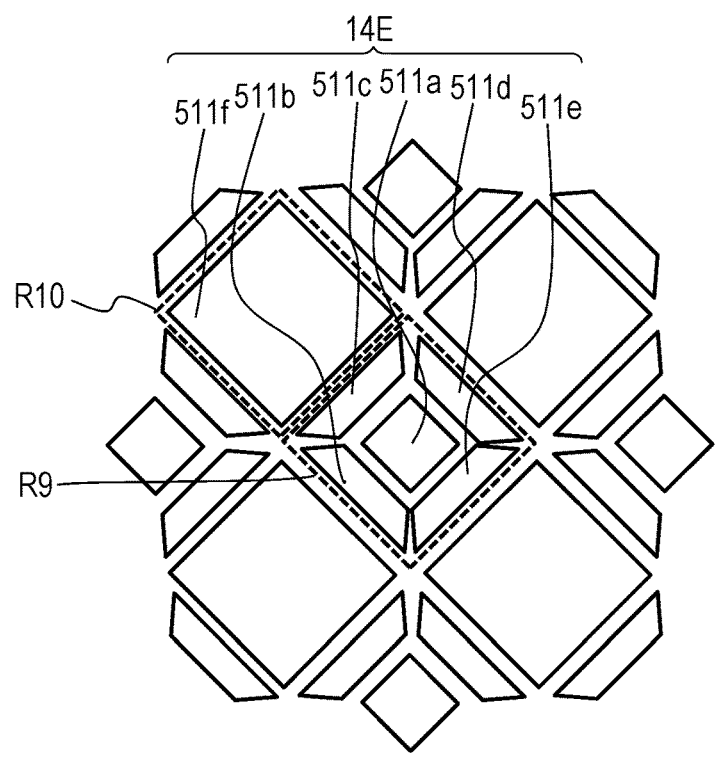
FIG. 24 is a schematic plan view showing one example of the shapes and arrangement of pixel electrodes in an imaging device according to a second modification of the third embodiment of the present disclosure.

FIG. 24 shows the arrangement of pixel electrodes in an imaging device according to the present modification when seen from a normal direction of a semiconductor substrate. As shown in FIG. 24, a pixel cell 14E includes six pixel electrodes, pixel electrodes 511a to 511f. A plurality of pixel cells 14E are arranged in a matrix.

The cross-section structure of the pixel cell 14E is basically the same as in the third embodiment shown in FIG. 18. A description of the cross-section structure will be omitted, and differences will be described. The pixel cell 14E includes two signal detection circuits and the pixel electrodes 511a to 511f. One of the two signal detection circuits is connected to the pixel electrode 511a while the other is connected to the pixel electrode 511f.

The pixel cell 14E includes a switching circuit. The switching circuit is configured to be capable of switching between electrical connections of the pixel electrodes 511b, 511c, 511d, and 511e to the pixel electrode 511a adjacent thereto and electrical connections of the pixel electrodes 511b, 511c, 511d, and 511e to the pixel electrode 511f adjacent thereto. More specifically, switches are provided between the pixel electrode 511a and each of the pixel electrodes 511b, 511c, 511d, and 511e adjacent thereto and between the pixel electrode 511f and each of the pixel electrodes 511b, 511c, 511d, and 511e adjacent thereto.

In a first operating mode, the pixel electrode 511a is electrically connected to the pixel electrodes 511b, 511c, 511d, and 511e adjacent thereto. The pixel electrode 511f is electrically insulated from the pixel electrodes 511b, 511c, 511d, and 511e adjacent thereto. In this state, signal charges collected by the pixel electrodes 511a, 511b, 511c, 511d, and 511e within the same pixel cell 14E are read out by the signal detection circuit connected to the pixel electrode 511a. Signal charges collected by the pixel electrode 511f are read out by the signal detection circuit connected to the pixel electrode 511f. A region R9 indicated by a thick broken line in FIG. 24 schematically represents a region of a photoelectric conversion layer where signal charges (for example, positive holes) generated by photoelectric conversion are collected by the pixel electrodes 511a, 511b, 511c, 511d, and 511e within the same pixel cell 14E. A region R10 indicated by a thick broken line in FIG. 24 schematically represents a region of the photoelectric conversion layer where signal charges (for example, positive holes) generated by photoelectric conversion are collected by the pixel electrode 511f. In the first operating mode, the shape and area of the region R9 can be made almost equal to those of the region R10. In other words, a difference in sensitivity between a sub-pixel cell including the pixel electrode 511a and a sub-pixel cell including the pixel electrode 511f can be made effectively 0.

Figure 25:
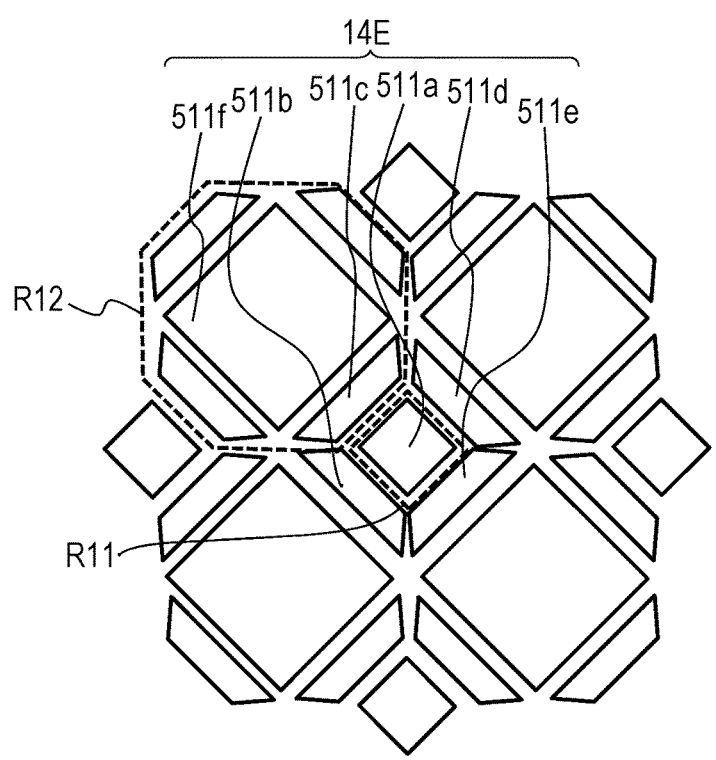
FIG. 25 is a schematic plan view showing the one example of the shapes and arrangement of the pixel electrodes in the imaging device according to the second modification of the third embodiment of the present disclosure.

In a second operating mode, the pixel electrode 511f is electrically connected to the pixel electrodes 511b, 511c, 511d, and 511e adjacent thereto. The pixel electrodes 511b, 511d, and 511e connected to the pixel electrode 511f here are each included in the different pixel cell 14E adjacent to the pixel cell 14E, to which the pixel electrode 511f belongs. The pixel electrode 511a is electrically insulated from the pixel electrodes 511b, 511c, 511d, and 511e adjacent thereto. In this state, signal charges collected by the pixel electrode 511f and the pixel electrodes 511b, 511c, 511d, and 511e adjacent thereto are read out by the signal detection circuit connected to the pixel electrode 511f. Signal charges collected by the pixel electrode 511a are read out by the signal detection circuit connected to the pixel electrode 511a. A region R11 indicated by a thick broken line in FIG. 25 schematically represents a region of the photoelectric conversion layer where signal charges (for example, positive holes) generated by photoelectric conversion are collected by the pixel electrode 511a. A region R12 indicated by a thick broken line in FIG. 25 schematically represents a region of the photoelectric conversion layer where signal charges (for example, positive holes) generated by photoelectric conversion are collected by the pixel electrode 511f and the pixel electrodes 511b, 511c, 511d, and 511e adjacent thereto. In the second operating mode, a difference in area between the regions R11 and R12 can be made. In other words, a sub-pixel cell including the pixel electrode 511a can be used as a low-sensitivity cell, and a sub-pixel cell including the pixel electrode 511f can be used as a high-sensitivity cell. Thus, in the second operating mode, two pieces of image data different in sensitivity can be simultaneously acquired. Like the first embodiment, wide-dynamic-range shooting is possible.

As has been described above, in the first operating mode, unit pixels identical in sensitivity are densely aligned, and a high-resolution image can be obtained by image processing. In the second operating mode, a wide-dynamic-range image can be obtained by merging signals from unit pixels different in sensitivity.

(Imaging Module)

Figure 26:
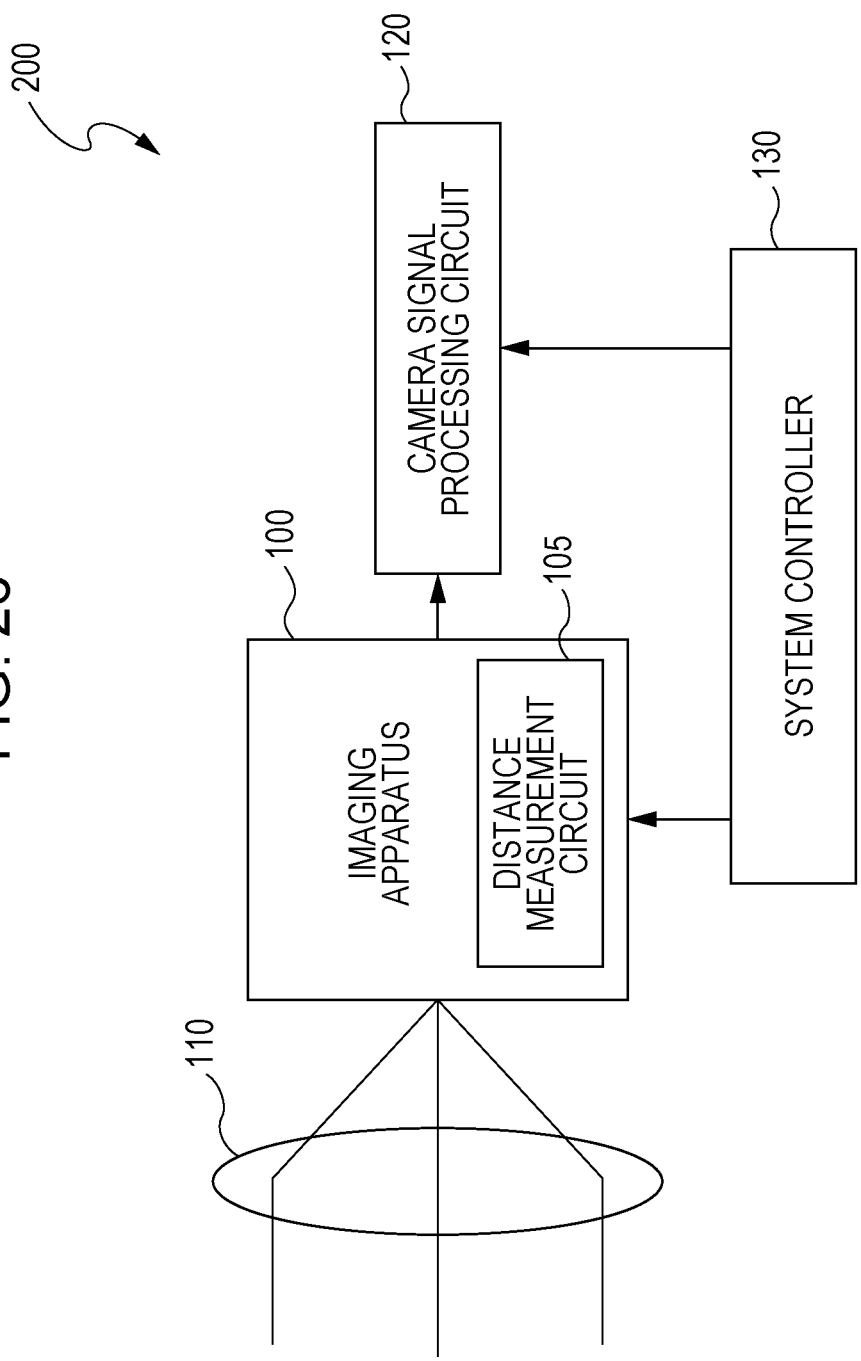
FIG. 26 is a block diagram showing an exemplary configuration of an imaging module including an imaging device according to an embodiment of the present disclosure.

FIG. 26 shows an exemplary configuration of an imaging module including an imaging device according to an embodiment of the present disclosure. An imaging module 200 shown in FIG. 26 includes an imaging device 100, an optical system 110 which includes a lens, a diaphragm, and the like, a camera signal processing circuit 120, and a system controller 130. The imaging module 200 may include an input interface including various buttons and a touch screen for accepting an input from a user.

As the imaging device 100, the imaging device 100A or the imaging device 100B described above can be used. In the configuration illustrated in FIG. 26, the imaging device 100 includes a distance measurement circuit 105. The distance measurement circuit 105 is, for example, a microcomputer. The distance measurement circuit 105 acquires outputs from a first signal detection circuit 25a and a second signal detection circuit 25b and calculates the distance between an imaging surface and a subject on the basis of the outputs.

The camera signal processing circuit 120 is composed of a semiconductor element or the like and generates image data by processing a pixel signal output from the imaging device 100. For example, the camera signal processing circuit 120 executes high dynamic range imaging on the basis of an output from the imaging device 100 in a wide-dynamic-range mode. A specific method for high dynamic range imaging is not limited to a particular method, and various signal processing methods used for high dynamic range imaging can be applied.

Provision of the camera signal processing circuit 120 can be implemented using a digital signal processor (DSP), an image signal processor (ISP), a field-programmable gate array (FPGA), or the like. The camera signal processing circuit 120 can include one or more memories. The camera signal processing circuit 120 is not limited to a processing circuit dedicated to high dynamic range imaging and high-resolution image formation. High dynamic range imaging and/or high-resolution image formation may be implemented by a combination of a general-purpose processing circuit and a program in which necessary processing is described. The program can be stored in a memory in the camera signal processing circuit 120, a memory in the system controller 130, or the like.

The system controller 130 is typically a semiconductor integrated circuit, such as a CPU, and controls portions in the imaging module 200. The system controller 130 can include one or more memories. The system controller 130 may include, as a part, the above-described distance measurement circuit 105.

The system controller 130 controls, for example, driving of a vertical scanning circuit 15, driving of the distance measurement circuit 105, switching of voltages to be applied from a voltage supply circuit 60 to sensitivity adjustment lines 28a and 28b, switching of connection in a switching circuit 64, and the like. The system controller 130, for example, receives a signal from the input interface and notifies the voltage supply circuit 60 of the voltages to be applied to the sensitivity adjustment lines 28a and 28b. Alternatively, the system controller 130 switches the connection in the switching circuit 64. That is, the system controller 130 executes switching between the wide-dynamic-range mode and a high-resolution mode. The system controller 130 may judge a range of illuminance in a subject on the basis of outputs from a first signal detection circuit 25a and a second signal detection circuit 25b and execute switching to the high-resolution mode.

As has been described above, according to the embodiments of the present disclosure, control of a sensitivity adjustment voltage to be applied to an auxiliary electrode allows switching between the wide-dynamic-range mode and the high-resolution mode. In addition to the above-described examples, various alterations may be made to an imaging device according to an embodiment of the present disclosure. For example, each of the signal detection transistor 11, the reset transistor 12, and the address transistor 13 may be an N-channel MOS or a P-channel MOS. It is not necessary that all the transistors are N-channel MOSs or P-channel MOSs. At least one of the signal detection transistor 11, the reset transistor 12, and the address transistor 13 may be a bipolar transistor.

An imaging device according to the present disclosure is useful in, for example, an image sensor or a digital camera. An imaging device according to the present disclosure can be used in a medical camera, a camera for a robot, a security camera, a camera used while being mounted on a vehicle, or the like.

What is claimed is:

1. An imaging device comprising:
   a counter electrode;
   a first pixel electrode facing the counter electrode;
   a second pixel electrode facing the counter electrode;
   a third pixel electrode facing the counter electrode;
   a photoelectric conversion layer sandwiched between the first pixel electrode, the second pixel electrode, and the third pixel electrode, and the counter electrode;
   a first signal detection circuit electrically connected to the first pixel electrode;
   a second signal detection circuit electrically connected to the second pixel electrode;
   a first switching element connected between the third pixel electrode and the first signal detection circuit; and
   a second switching element connected between the third pixel electrode and the second signal detection circuit.

2. The imaging device according to claim 1, wherein the first pixel electrode, the second pixel electrode, and the third pixel electrode are located in a same layer.

3. The imaging device according to claim 1, wherein the first switching element and the second switching element electrically connect the third pixel electrode to either one of the first signal detection circuit and the second signal detection circuit.

4. The imaging device according to claim 1, wherein a ratio of a sum of an area of the second pixel electrode and an area of the third pixel electrode to an area of the first pixel electrode is 0.01 or more and 1 or less.

5. The imaging device according to claim 1, further comprising:
   an auxiliary electrode located around the first pixel electrode, the second pixel electrode, and the third pixel electrode.

6. The imaging device according to claim 1, further comprising:
   a distance measurement circuit that calculates a distance from a subject on the basis of an output from the first signal detection circuit and an output from the second signal detection circuit.

7. An imaging module comprising:
   an imaging device according to claim 1; and
   a camera signal processing circuit, wherein
   the imaging device outputs a pixel signal on the basis of an output from the first signal detection circuit and an output from the second signal detection circuit, and
   the camera signal processing circuit generates image data on the basis of the pixel signal.

* * * * *